(12) United States Patent
Nomura

(10) Patent No.: US 6,448,810 B1
(45) Date of Patent: Sep. 10, 2002

(54) BIDIRECTIONAL BUS-REPEATER CONTROLLER

(75) Inventor: Masahiro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/482,513

(22) Filed: Jan. 14, 2000

(30) Foreign Application Priority Data

Jan. 14, 1999 (JP) .......................................... 11-007678

(51) Int. Cl.⁷ .......................................... H03K 19/0175
(52) U.S. Cl. .......................................... 326/82; 326/112
(58) Field of Search .............................. 326/82, 83, 86, 326/56–58, 112, 119

(56) References Cited

U.S. PATENT DOCUMENTS

| 5,214,330 A | * | 5/1993 | Okazaki | 326/90 |
| 5,248,908 A | * | 9/1993 | Kimura | 326/38 |
| 5,274,769 A | * | 12/1993 | Ishida | 710/31 |
| 5,726,589 A | * | 3/1998 | Cahill et al. | 326/81 |
| 5,736,870 A | * | 4/1998 | Greason et al. | 326/80 |

FOREIGN PATENT DOCUMENTS

| JP | 57-187726 | 11/1982 | G06F/3/00 |
| JP | 2-211567 | 8/1990 | G06F/13/36 |
| JP | 03007424 | * 1/1991 | 326/58 |

OTHER PUBLICATIONS

Rhyne, "Fundamental of Digital Systems Design", N.J., 1973, pp. 70–71, 1973.*

* cited by examiner

Primary Examiner—Michael Tokar
Assistant Examiner—James H. Cho
(74) Attorney, Agent, or Firm—Sughrue Mion, PLLC

(57) ABSTRACT

The present invention provides a bidirectional bus repeater controller comprising: a bidirectional bus line for bidirectional transmissions of signals; at least a bidirectional repeater on the bidirectional bus line for controlling bidirectional transmissions of signals on the bidirectional bus line; at least a bus driver connected to the bidirectional bus line for transmitting inputted signals to the bidirectional bus line in accordance with a bus driver control signal; at least a bus receiver connected to the bidirectional bus line for receiving signals from the bidirectional bus line; and a logic circuit extending along the bidirectional bus line and being connected to the at least bidirectional repeater for transmitting bidirectional bus repeater control signals to the at least bidirectional repeater upon input of the bus driver control signal.

24 Claims, 27 Drawing Sheets

BIDIRECTIONAL BUS-REPEATER CONTROLLER

BACKGROUND OF THE INVENTION

The present invention relates to a bidirectional bus-repeater controller, and more particularly to a bidirectional bus-repeater controller for controlling a bidirectional repeater placed in a bidirectional busline in a semiconductor device such as VLSI, and further particularly to a bidirectional bus-repeater controller for controlling bidirectional signal transmissions in the bidirectional repeater wherein a relatively long bidirectional busline is divided.

As the semiconductor device such as VLSI has multi-functions, complicated operations of controlling the bidirectional bus-repeater on the bidirectional bus-repeater is required, for which reason the bus line is made unidirectional or signal lines are used as dedicated lines. Upon progresses of the system-on-chip, it is required to reduce the delay in signal transmission on a wiring region or a wiring.

In order to respond to the above requirement, it was proposed to use the bidirectional bus. It was further proposed to use the repeater for suppressing the signal delay due to the long interconnection or wiring, which is disclosed in Addison-Wesley Publishing Company 1990, "circuits interconnections and packaging for VLSI". It was further proposed to place the bidirectional bus repeater on the bidirectional bus, which is disclosed in Japanese laid-open patent publication No. 6-28304.

FIG. 1 is a block diagram illustrative of a conventional bidirectional bus-repeater controller. The conventional bidirectional bus-repeater controller has the following circuit configuration. A first set of a first bus driver 121 and a first bus receiver 131 is connected to a bus line 101. The first set of the first bus driver 121 and the first bus receiver 131 operates the signal transmission and receiving with the bus line 101 upon input of a first bus driver control signal S141. A second set of a second bus driver 122 and a second bus receiver 132 is connected to the bus line 101. The second set of the second bus driver 122 and the second bus receiver 132 operates the signal transmission and receiving with the bus line 101 upon input of a second bus driver control signal S142. A third set of a third bus driver 123 and a third bus receiver 133 is connected to the bus line 101. The third set of the third bus driver 123 and the third bus receiver 133 operates the signal transmission and receiving with the bus line 101 upon input of a third bus driver control signal S143.

First and second bidirectional repeaters 102 and 103 are connected on the bus line 101. The first and second bidirectional repeaters 102 and 103 are connected to a controller 108 which is further connected to an internal buffer which is not illustrated. The first bidirectional repeater 102 receives bidirectional repeater control signals 161L and 161R, so that the first bidirectional repeater 102 operates bidirectional transmissions of data signals and address signals on the bus line 101. The second bidirectional repeater 103 receives bidirectional repeater control signals 162L and 162R, so that the second bidirectional repeater 103 operates bidirectional transmissions of data signals and address signals on the bus line 101.

The single controller 108 controls the plural bidirectional repeaters 102 and 103. It is necessary that a large number of control signal lines L are provided for transmissions of the bidirectional repeater control signals 161L, 161R, 162L and 162R from the controller 108 to buffers in the directional repeaters 102 and 103.

As the VLSI is required to scale down the internal structure, the number of processing circuit blocks connected to the bus line 101 is increased whereby the number of the bidirectional repeaters is increased, whereby a large number of the control signal lines L is required. As a result, layout f the control signal lines and also layout of other signal lines are so made that the control signal lines and the other signal lines are made long, whereby signal delays are likely to appear on the control signal lines and the other signal lines.

The conventional bidirectional bus-repeater controller is disadvantageous in that layout of the control signal lines is made large whereby signal delays appear. This makes it difficult to improve high speed performance of the data processing.

In the above circumstances, it had been required to develop a novel bidirectional bus-repeater controller free from the above problem.

SUMMARY OF THE INVENTION

Accordingly, it is an object of the present invention to provide a novel bidirectional bus-repeater controller free from the above problems.

It is a further object of the present invention to provide a novel bidirectional bus-repeater controller wherein a relatively long bus line is divided so that bidirectional signal transmissions are controlled by the individual bidirectional repeaters to suppress signal delays and to allow improvement in high speed performance of data processings.

The present invention provides a bidirectional bus repeater controller comprising: a bidirectional bus line for bidirectional transmissions of signals; at least a bidirectional repeater on the bidirectional bus line for controlling bidirectional transmissions of signals on the bidirectional bus line; at least a bus driver connected to the bidirectional bus line for transmitting inputted signals to the bidirectional bus line in accordance with a bus driver control signal; at least a bus receiver connected to the bidirectional bus line for receiving signals from the bidirectional bus line; and a logic circuit extending along the bidirectional bus line and being connected to the at least bidirectional repeater for transmitting bidirectional bus repeater control signals to the at least bidirectional repeater upon input of the bus driver control signal.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
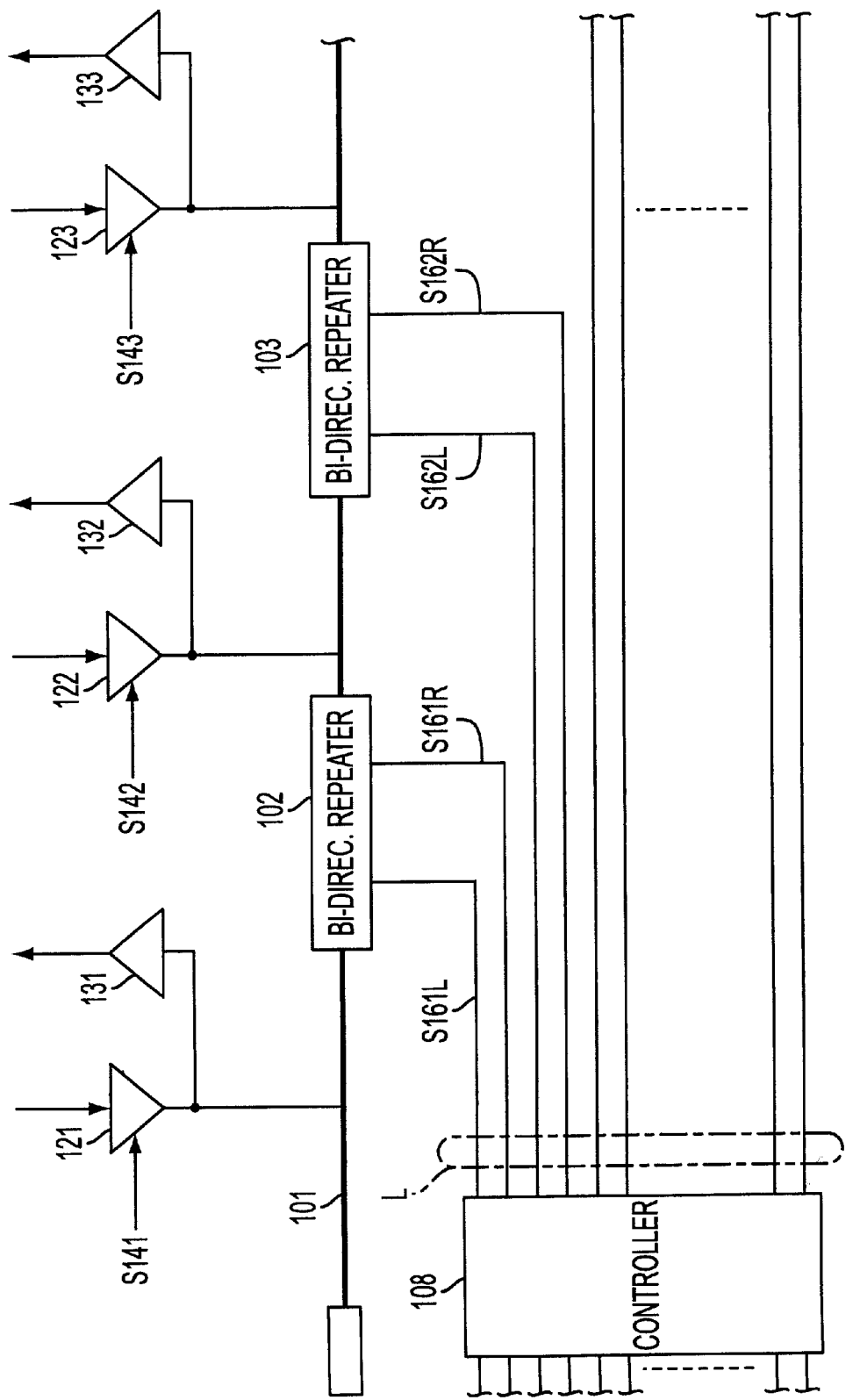
FIG. 1 is a block diagram illustrative of a conventional bidirectional bus-repeater controller.

The first present invention provides a logic circuitry being connected at least a bidirectional repeater on a bidirectional bus line for transmitting bidirectional bus repeater control signals to the at least bidirectional repeater upon input of a bus driver control signal which is also inputted into at least a bus driver.

It is preferable that the logic circuitry comprises an OR-gate network.

It is further preferable that the OR-gate network further comprises a first series connection of first directional OR-gates inputted with a logic-OR signal from a previous stage and with the bus driver control signal for transmitting logic signals in a first direction, and a first series connection of second directional OR-gates inputted with a logic-OR signal from a previous stage and with the bus driver control signal for transmitting logic signals in a second direction opposite to the first direction, and that an output terminal of at least one of the first directional OR-gates is connected to the at least bidirectional repeater for transmitting a logic-OR signal outputted from the one of the first directional OR-gates as a first bidirectional repeater control signal to the at least bidirectional repeater, and an output terminal of at least one of the second directional OR-gates is also connected to the at least bidirectional repeater for transmitting a logic-OR signal outputted from the one of the second directional OR-gates as a second bidirectional repeater control signal to the at least bidirectional repeater.

It is further more preferable that the first directional OR-gates and the second directional OR-gates are two-input OR-gates having two input terminals, where one input terminal being for receiving the bus driver control signal and another input terminal being for receiving a signal from a previous stage OR-gate.

It is also preferable that the first directional OR-gates and the second directional OR-gates are multiple-input OR-gates having three more input terminals, where one input terminal being for receiving a signal from a previous stage OR-gate and other input terminals being for receiving a plurality of the bus driver control signals.

It is also preferable that the OR-gate network further comprises a first series connection of first directional two-input OR-gates inputted with a logic-OR signal from a previous stage and with an output signal from an output terminal of a multiple-input OR-gate having the same number of input terminals as the plural bus driver control signals for transmitting logic signals in a first direction, and a first series connection of second directional two-input OR-gates inputted with a logic-OR signal from a previous stage and with the output signal from the output terminal of the multiple-input OR-gate for transmitting logic signals in a second direction opposite to the first direction, and that an output terminal of at least one of the first directional two-input OR-gates is connected to the at least bidirectional repeater for transmitting a logic-OR signal outputted from the one of the first directional two-input OR-gates as a first bidirectional repeater control signal to the at least bidirectional repeater, and an output terminal of at least one of the second directional two-input OR-gates is also connected to the at least bidirectional repeater for transmitting a logic-OR signal outputted from the one of the second directional two-input OR-gates as a second bidirectional repeater control signal to the at least bidirectional repeater.

It is preferable to further comprise a logic AND block extending on intermediate points of the first and second series connections of the first and second directional logic OR-gates.

It is preferable to further comprise at least a resistor between the OR-gate network and the at least bidirectional repeater for transmitting the bidirectional repeater control signal from the OR-gate network through the resistor to the at least bidirectional repeater.

It is preferable to further comprise at least a resistor at an input side of each of the bus driver for allowing the bus driver control signal to be inputted through the resistor into the bus driver.

It is preferable to further comprise at least a resistor at an input side on a data signal line connected with each of the bus driver for allowing data signals to be inputted through the resistor into the bus driver.

It is preferable to further comprise at least a resistor at an input side of the OR-gate network for allowing the bus driver control signal to be inputted through the resistor into the OR-gate network.

It is preferable to further comprise a pipeline resistor extending on both the OR-gate network and the at least bidirectional repeater.

It is preferable that the bus driver comprises a dynamic three state buffer.

It is also preferable that the at least bidirectional repeater comprises a dynamic three state buffer.

It is also preferable that the OR-gate network is provided with at least a dynamic buffer, at least a switch and at least a latch circuit.

It is further preferable that the at least dynamic buffer comprises a co-operating dynamic buffer operating to accelerate falling of an output.

It is also preferable that the OR-gate network is provided with a detector for detecting a rise of an output signal and a latch circuit connected to the detector for receiving an output from the detector.

The second present invention provides a bidirectional bus repeater controller comprising: a bidirectional bus line for bidirectional transmissions of signals; at least a bidirectional repeater on the bidirectional bus line for controlling bidirectional transmissions of signals on the bidirectional bus line; at least a bus driver connected to the bidirectional bus line for transmitting inputted signals to the bidirectional bus line in accordance with a bus driver control signal; at least a bus receiver connected to the bidirectional bus line for receiving signals from the bidirectional bus line; and a logic circuit extending along the bidirectional bus line and being connected to the at least bidirectional repeater for transmitting bidirectional bus repeater control signals to the at least bidirectional repeater upon input of the bus driver control signal.

It is preferable that the logic circuit comprises an OR-gate network.

It is further preferable that the OR-gate network further comprises a first series connection of first directional OR-gates inputted with a logic-OR signal from a previous stage and with the bus driver control signal for transmitting logic signals in a first direction, and a first series connection of second directional OR-gates inputted with a logic-OR signal from a previous stage and with the bus driver control signal for transmitting logic signals in a second direction opposite to the first direction, and that an output terminal of at least one of the first directional OR-gates is connected to the at least bidirectional repeater for transmitting a logic-OR signal outputted from the one of the first directional OR-gates as a first bidirectional repeater control signal to the at least bidirectional repeater, and an output terminal of at least one of the second directional OR-gates is also connected to the at least bidirectional repeater for transmitting a logic-OR signal outputted from the one of the second directional OR-gates as a second bidirectional repeater control signal to the at least bidirectional repeater.

It is further more preferable that the first directional OR-gates and the second directional OR-gates are two-input OR-gates having two input terminals, where one input terminal being for receiving the bus driver control signal and another input terminal being for receiving a signal from a previous stage OR-gate.

It is also preferable that the first directional OR-gates and the second directional OR-gates are multiple-input OR-gates having three more input terminals, where one input terminal being for receiving a signal from a previous stage OR-gate and other input terminals being for receiving a plurality of the bus driver control signals.

It is also preferable that the OR-gate network further comprises a first series connection of first directional two-input OR-gates inputted with a logic-OR signal from a previous stage and with an output signal from an output terminal of a multiple-input OR-gate having the same number of input terminals as the plural bus driver control signals for transmitting logic signals in a first direction, and a first series connection of second directional two-input OR-gates inputted with a logic-OR signal from a previous stage and with the output signal from the output terminal of the multiple-input OR-gate for transmitting logic signals in a second direction opposite to the first direction, and wherein an output terminal of at least one of the first directional two-input OR-gates is connected to the at least bidirectional repeater for transmitting a logic-OR signal outputted from the one of the first directional two-input OR-gates as a first bidirectional repeater control signal to the at least bidirectional repeater, and an output terminal of at least one of the second directional two-input OR-gates is also connected to the at least bidirectional repeater for transmitting a logic-OR signal outputted from the one of the second directional two-input OR-gates as a second bidirectional repeater control signal to the at least bidirectional repeater.

It is also preferable to further comprise a logic AND block extending on intermediate points of the first and second series connections of the first and second directional logic OR-gates.

It is also preferable to further comprise at least a resistor between the OR-gate network and the at least bidirectional repeater for transmitting the bidirectional repeater control signal from the OR-gate network through the resistor to the at least bidirectional repeater.

It is also preferable to further comprise at least a resistor at an input side of each of the bus driver for allowing the bus driver control signal to be inputted through the resistor into the bus driver.

It is also preferable to further comprise at least a resistor at an input side on a data signal line connected with each of the bus driver for allowing data signals to be inputted through the resistor into the bus driver.

It is also preferable to further comprise at least a resistor at an input side of the OR-gate network for allowing the bus driver control signal to be inputted through the resistor into the OR-gate network.

It is also preferable to further comprise a pipeline resistor extending on both the OR-gate network and the at least bidirectional repeater.

It is also preferable that the bus driver comprises a dynamic three state buffer.

It is also preferable that the at least bidirectional repeater comprises a dynamic three state buffer.

It is also preferable that the OR-gate network is provided with at least a dynamic buffer, at least a switch and at least a latch circuit.

It is further preferable that the at least dynamic buffer comprises a co-operating dynamic buffer operating to accelerate falling of an output.

It is also preferable that the OR-gate network is provided with a detector for detecting a rise of an output signal and a latch circuit connected to the detector for receiving an output from the detector.

PREFERRED EMBODIMENT

FIRST EMBODIMENT

Figure 2:
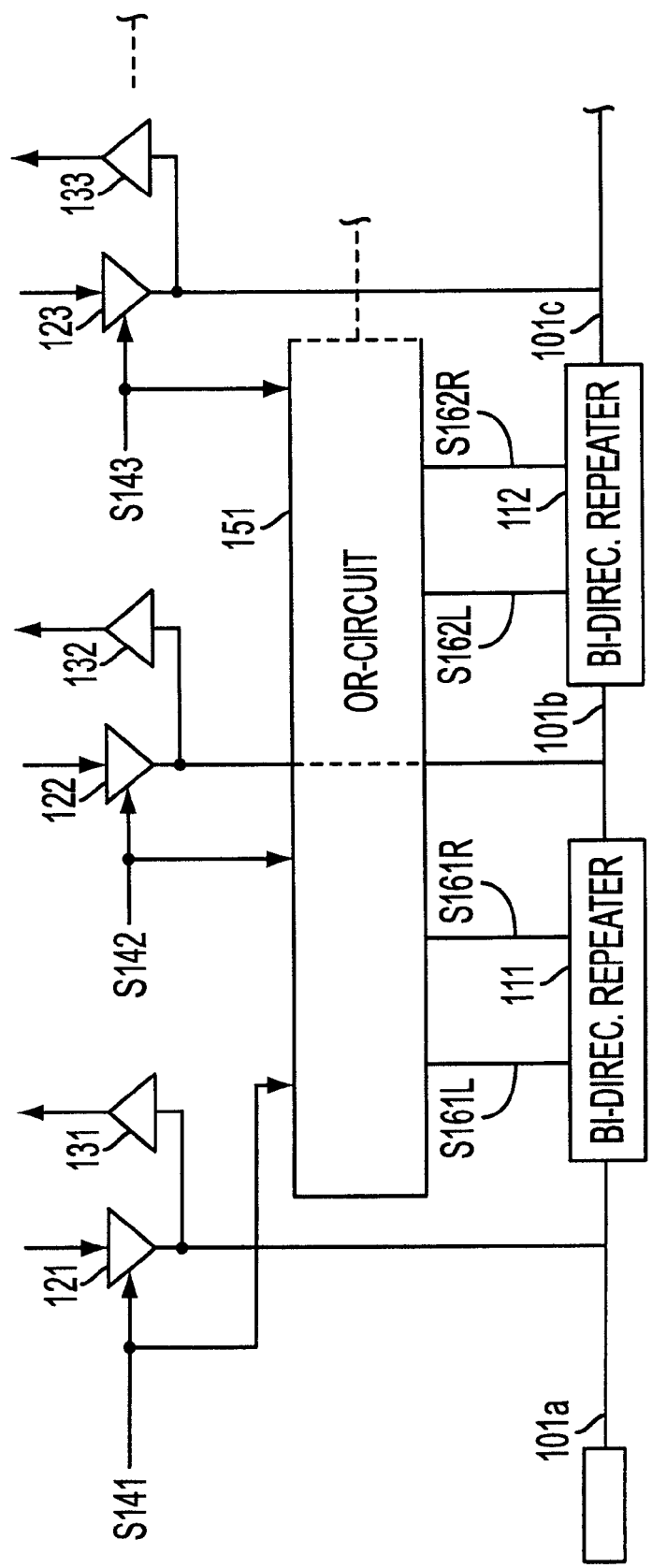
FIG. 2 is a block diagram illustrative of a novel bidirectional bus-repeater controller in a first embodiment in accordance with the present invention.

A first embodiment according to the present invention will be described in detail with reference to the drawings. "R" and "L" represent right and left directions of signal transmissions. FIG. 2 is a block diagram illustrative of a novel bidirectional bus-repeater controller in a first embodiment in accordance with the present invention. A bus line 101 is divided into bus lines 101a, 101b, 101c, etc. A plurality of bidirectional repeaters 111 and 112 are provided on the bus line 101 so that the bidirectional repeater 111 is connected between the bus line 101a and bus line 101b, whilst the bidirectional repeater 112 is connected between the bus line 101b and bus line 101c. A first set of a first bus driver 121 and a first bus receiver 131 is connected the bus line 101a. A second set of a second bus driver 122 and a second bus receiver 132 is connected to the bus line 101b. A third set of a third bus driver 123 and a third bus receiver 133 is connected to the bus line 101c. The bus driver 121 receives an input of a bus driver control signal S141. If the bus control signal S141 is high level, or "1" which represent "enable", an input signal inputted into the bus driver 121 is transmitted to the bus line 101a. This output signal is subjected to a buffering process by the bidirectional repeater 111 for subsequent high speed transmission on the bus line 101a. The bus driver 122 receives an input of a bus driver control signal S142. If the bus driver control signal S142 is high level or "1" which represent "enable", an input signal inputted into the bus driver 122 is transmitted to the bus line 101b. This output signal is subjected to a buffering process by the bidirectional repeaters 111 and 112 for subsequent high speed transmission on the bus line 101b. The bus driver 123 receives an input of a bus driver control signal S143. If the bus driver control signal S143 is high level or "1" which represent "enable", an input signal inputted into the bus driver 123 is transmitted to the bus line 101c. This output signal is subjected to a buffering process by the bidirectional repeater 112 for subsequent high speed transmission on the bus line 101c.

The bus receivers 131, 132 and 133 receive bus data from the bus lines 101a, 101b and 101c, so as to transmit the signals to the bus drivers 121, 122, and 123 which receive the enable signal or the bus driver control signals S141, S142 and S143 which are high level "1".

An OR-circuit 151 is connected to the bidirectional repeaters 111 and 112 to transmit bidirectional repeater control signals S161L and S161R to the bidirectional repeater 111 and also transmit bidirectional repeater control signals S162L and S162R to the bidirectional repeater 112. The OR-circuit 151 receives the bus driver control signals S141, S142, and S143 for OR-operations of the bus driver control signals S141, S142, and S143 to generate the bidirectional repeater control signals S161L and S161R and S162L and S162R which are transmitted to the bidirectional repeaters 111 and 112 respectively, so that signal transmissions are made at a starting point of the bus driver receiving the bus driver control signal which is high level "1".

Figure 3:
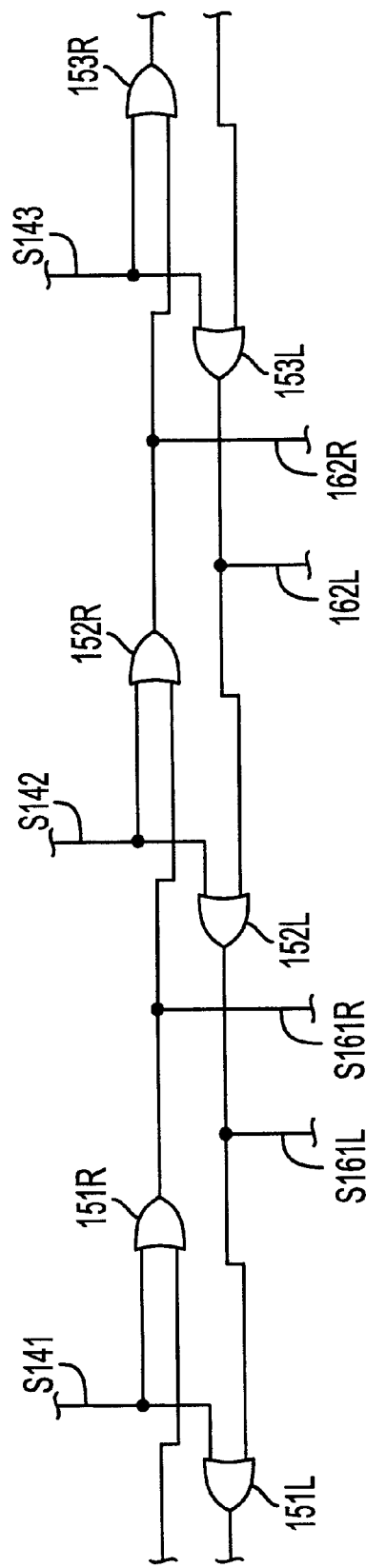
FIG. 3 is a circuit diagram illustrative of a circuit configuration of the OR-circuit of the bidirectional repeater controller.

FIG. 3 is a circuit diagram illustrative of a circuit configuration of the OR-circuit 151 of the bidirectional repeater controller. The OR-circuit 151 comprises two-input logical OR-gates 151L/151R, 152L/152R, and 153L/153R. The bus driver control signal S141 is inputted into the OR-gates 151R and 151L. The bus driver control signal S142 is inputted into the OR-gates 152R and 152L. The bus driver control signal S143 is inputted into the OR-gates 153R and 153L. An output of the OR-gate 151R is connected to the input of the OR-gate 152R. An output of the OR-gate 152R is connected to the input of the OR-gate 153R. An output of the OR-gate 153L is connected to the input of the OR-gate 152L. An output of the OR-gate 152L is connected to the input of the OR-gate 151L. An output signal from the OR-gate 151R is supplied as the bidirectional repeater control signal S161R. An output signal from the OR-gate 152L is supplied as the bidirectional repeater control signal S161L. An output signal from the OR-gate 152R is supplied as the bidirectional repeater control signal S162R. An output signal from the OR-gate 153L is supplied as the bidirectional repeater control signal S162L. If any one of the bus driver control signals S141, S142, and S143 is high level "1", then the bus driver receiving the bus driver control signal of "1" is taken to be a starting point for signal transmission.

Figure 4:
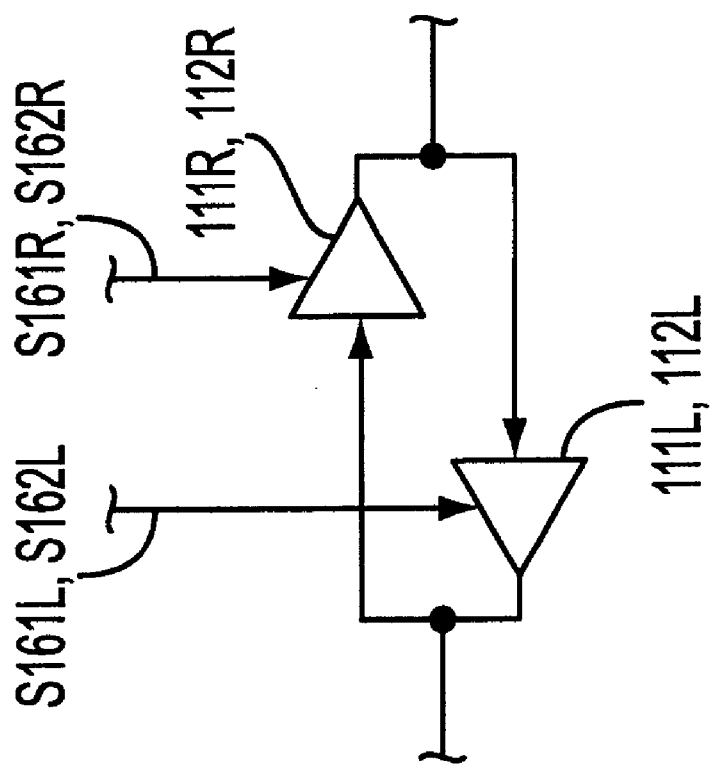
FIG. 4 is a circuit diagram illustrative of a circuit configuration of each of the bidirectional repeaters in the bidirectional bus repeater controller of FIG. 2.

FIG. 4 is a circuit diagram illustrative of a circuit configuration of each of the bidirectional repeaters in the bidirectional bus repeater controller of FIG. 2. The bidirectional repeater 111 comprises a first three-state buffer 111L and a second three-state buffer 111R. The first three-state buffer 111L receives the bidirectional repeater control signal S161L. The second three-state buffer 111R receives the bidirectional repeater control signal S161R. The bidirectional repeater 112 comprises a first three-state buffer 112L and a second three-state buffer 112R. The first three-state buffer 112L receives the bidirectional repeater control signal S162L. The second three-state buffer 112R receives the bidirectional repeater control signal S162R.

Figure 5:
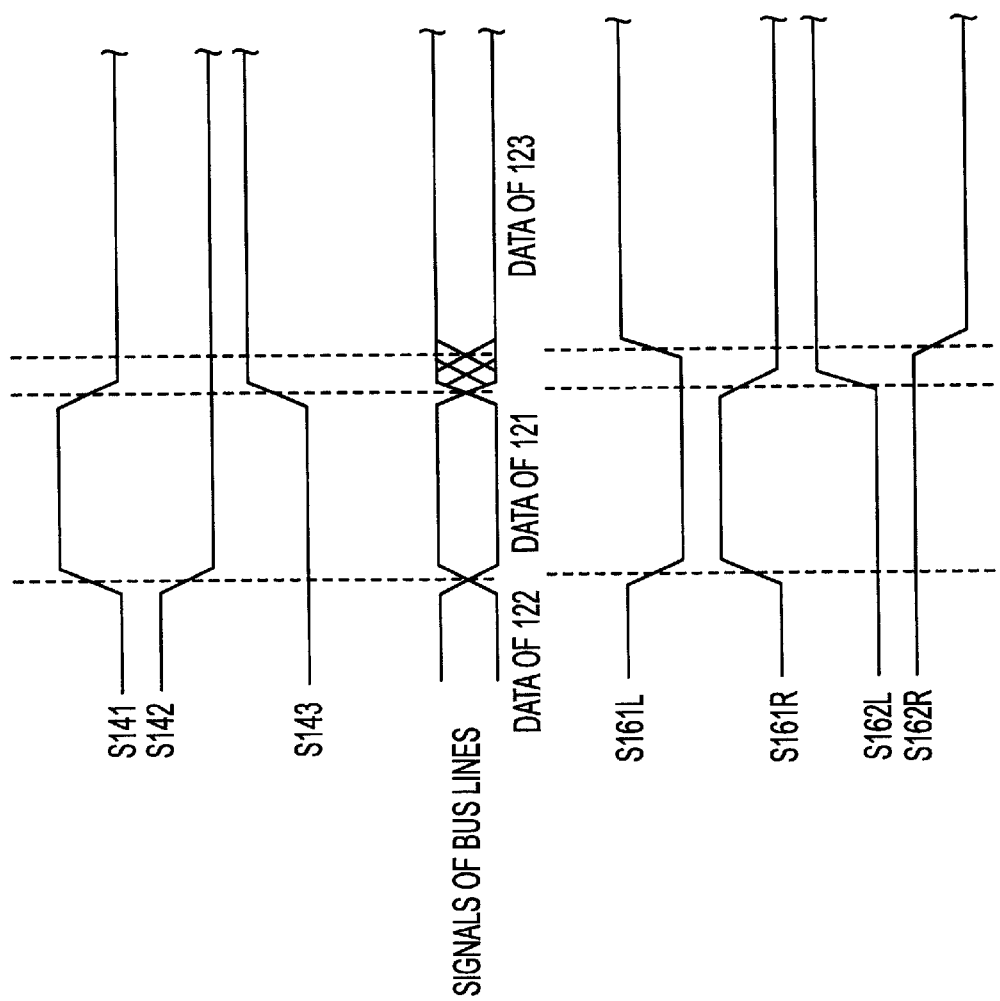
FIG. 5 is a timing chart illustrative of waveforms of control signals of the bidirectional bus repeater controller of FIG. 2.

Operations of the bidirectional bus repeater controller of FIG. 2 will be described. FIG. 5 is a timing chart illustrative of waveforms of control signals of the bidirectional bus repeater controller of FIG. 2. Data transmissions on the bus lines 101a, 101b and 101c upon the bus driver control signals S141, S142 and S143 are exclusive operations. A change from "1" to "0" appears at one position. A change from "0" to "1" also appears at one position. Data signals on the bus lines 101a, 101b and 101c are processing data in the bus drivers 121, 122 and 123 receiving the high level or enable state of the bus driver control signals S141, S142 and S143.

The OR-circuit also operates as shown in FIG. 5. If the bus driver control signal S142 is high level "1", the bidirectional repeater control signal S161L is high level "1", whilst the bidirectional repeater control signal S161R is high level "0", and the bidirectional repeater control signal S162L is high level "0", whilst the bidirectional repeater control signal S162R is high level "1". If the bus driver control signal S141 is high level "1", the bidirectional repeater control signal S161L is high level "0", whilst the bidirectional repeater control signal S161R is high level "1", and the bidirectional repeater control signal S162L is high level "0", whilst the bidirectional repeater control signal S162R is high level "1". If the bus driver control signal S143 is high level "1", the bidirectional repeater control signal S161L is high level "1", whilst the bidirectional repeater control signal S161R is high level "0", and the bidirectional repeater control signal S162L is high level "1", whilst the bidirectional repeater control signal S162R is high level "0".

Each of the bidirectional repeaters 111 and 112 also operates as shown in FIG. 5. If the bidirectional repeater control signal S161L is "1", the bidirectional repeater control signal S161R is "0", the bidirectional repeater control signal S162L is "0", the bidirectional repeater control signal S162R is "1", then the first three-state buffer 111L in the bidirectional repeater 111 turns ON to enter into the driving state whilst the second three-state buffer 111R in the bidirectional repeater 111 turns OFF to enter into the high impedance state, as well as the first three-state buffer 112L in the bidirectional repeater 112 turns OFF to enter into the high impedance state whilst the second three-state buffer 112R in the bidirectional repeater 112 turns ON to enter into the driving state, whereby signal are transmitted from the bus driver 122 at a starting point in both directions.

If the bidirectional repeater control signal S161L is "0", the bidirectional repeater control signal S161R is "1", the bidirectional repeater control signal S162L is "0", the bidirectional repeater control signal S162R is "1", then the first three-state buffer 111L in the bidirectional repeater 111 turns OFF to enter into the high impedance state whilst the second three-state buffer 111R in the bidirectional repeater 111 turns ON to enter into the driving state, as well as the first three-state buffer 112L in the bidirectional repeater 112 turns OFF to enter into the high impedance state whilst the second three-state buffer 112R in the bidirectional repeater 112 turns ON to enter into the driving state, whereby signal are transmitted from the bus driver 121 at a starting point in both directions.

If the bidirectional repeater control signal S161L is "1", the bidirectional repeater control signal S161R is "0", the bidirectional repeater control signal S162L is "1", the bidirectional repeater control signal S162R is "0", then the first three-state buffer 111L in the bidirectional repeater 111 turns ON to enter into the driving state whilst the second three-state buffer 111R in the bidirectional repeater 111 turns OFF to enter into the high impedance state, as well as the first three-state buffer 112L in the bidirectional repeater 112 turns ON to enter into the driving state whilst the second three-state buffer 112R in the bidirectional repeater 112 turns OFF to enter into the high impedance state, whereby signal are transmitted from the bus driver 123 at a starting point in both directions.

Figure 6:
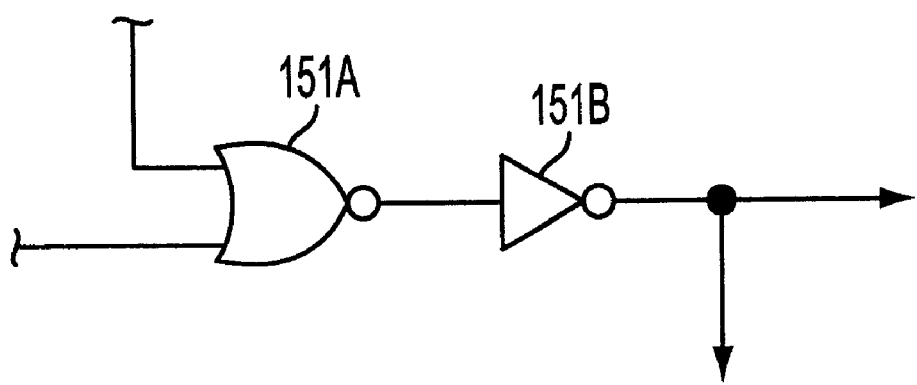
FIG. 6 is a circuit diagram illustrative of another circuit configuration of the OR-circuit shown in FIG. 2 as a first modification to the circuit configuration of FIG. 3.
Figure 7:
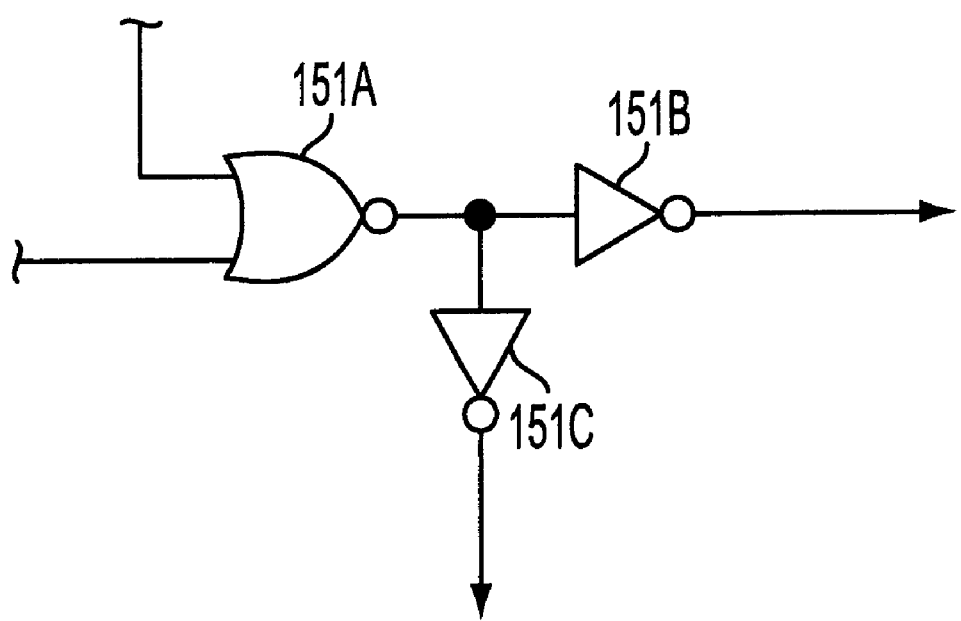
FIG. 7 is a circuit diagram illustrative of still another circuit configuration of the OR-circuit shown in FIG. 2 as a second modification to the circuit configuration of FIG. 3.

The OR-circuit may be modified as follows. FIG. 6 is a circuit diagram illustrative of another circuit configuration of the OR-circuit shown in FIG. 2 as a first modification to the circuit configuration of FIG. 3. FIG. 7 is a circuit diagram illustrative of still another circuit configuration of the OR-circuit shown in FIG. 2 as a second modification to the circuit configuration of FIG. 3

In FIG. 6, the OR-circuit 151 comprises a NOR-gate 151A and an inverter 151B having an input terminal connected to an output terminal of the NOR gate 151A, wherein an output from the inverter 151B is used for both driving the next stage of the logic gate and driving the bidirectional repeater.

In FIG. 7, the OR-circuit 151 comprises a NOR-gate 151A, an inverter 151B having an input terminal connected to an output terminal of the NOR gate 151A and an inverter 151C having an input terminal connected to the output terminal of the NOR gate 151A, wherein an output from the inverter 151B is used for driving the next stage of the logic gate and an output from the inverter 1S1C is used for driving the bidirectional repeater.

Figure 8:
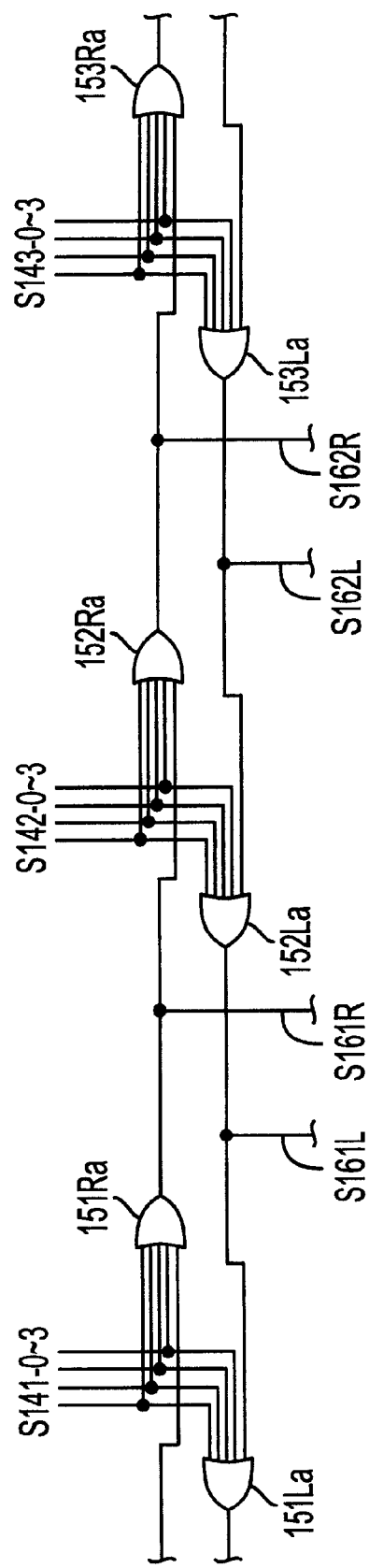
FIG. 8 is a circuit diagram illustrative of another circuit configuration of the OR-circuit shown in FIG. 1 as a first modification to the circuit configuration of FIG. 3.

FIG. 8 is a circuit diagram illustrative of another circuit configuration of the OR-circuit shown in FIG. 1 as a first modification to the circuit configuration of FIG. 3. If a plurality of the bus drivers are connected between the bidirectional repeaters 111 and 112, as shown in FIG. 8, multi-input OR-gates 151Ra, 151La, 152Ra, 152La, 153Ra, 153La having multiple input terminals necessary for responding to the plurality of the bus drivers are used in place of the two input OR-gates. If the bus driver control signals S141-0, S141-1, S141-2, S141-3 are inputted into the multi-input OR-gates 151Ra and 151La, and the bus driver control signals S142-0, S142-1, S142-2, S142-3 are inputted into the multi-input OR-gates 152Ra and 152La, and the bus driver control signals S143-0, S143-1, S143-2, S143-3 are inputted into the multi-input OR-gates 153Ra and 153La, then each of the multi-input OR-gates 151Ra, 151La, 152Ra, 152La, 153Ra, 153La has five input terminals. An output of the OR-gate 151Ra is connected to the input of the OR-gate 152Ra. An output of the OR-gate 152Ra is connected to the input of the OR-gate 153Ra. An output of the OR-gate 153La is connected to the input of the OR-gate 152La. An output of the OR-gate 152La is connected to the input of the OR-gate 151La. An output signal from the OR-gate 151Ra is supplied as the bidirectional repeater control signal S161R An output signal from the OR-gate 152La is supplied as the bidirectional repeater control signal S161L. An output signal from the OR-gate 152Ra is supplied as the bidirectional repeater control signal S162R. An output signal from the OR-gate 153La is supplied as the bidirectional repeater control signal S162L.

Figure 9:
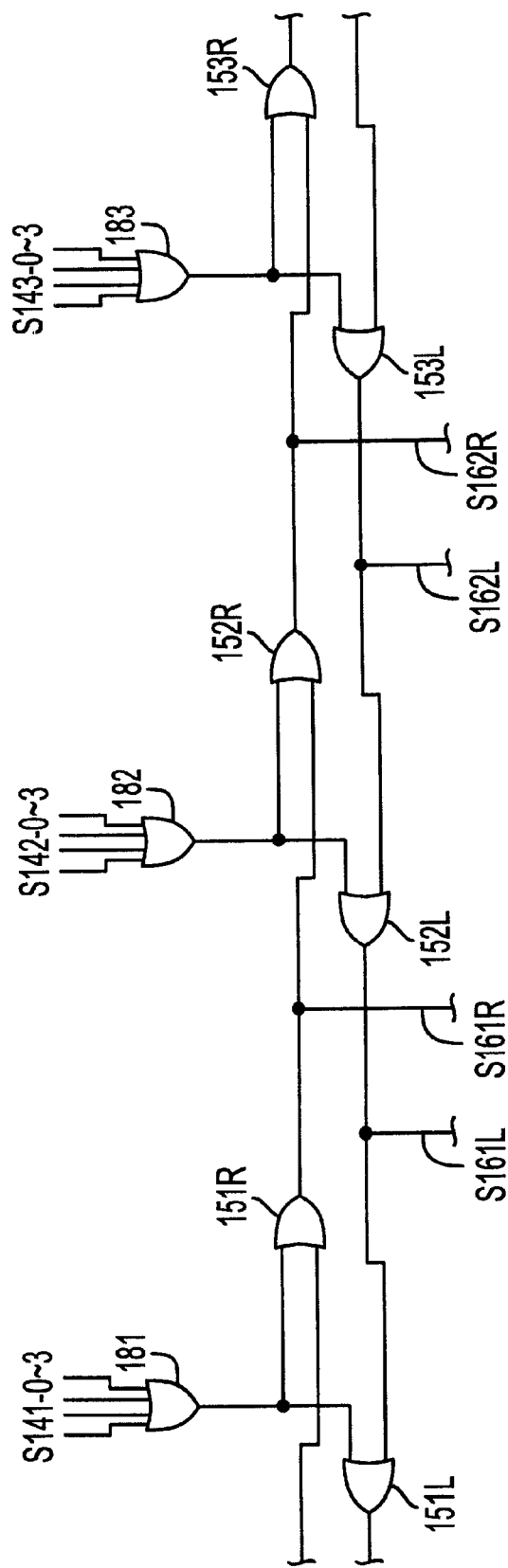
FIG. 9 is a circuit diagram illustrative of still another circuit configuration of the OR-circuit of the bidirectional repeater controller.
Figure 10:
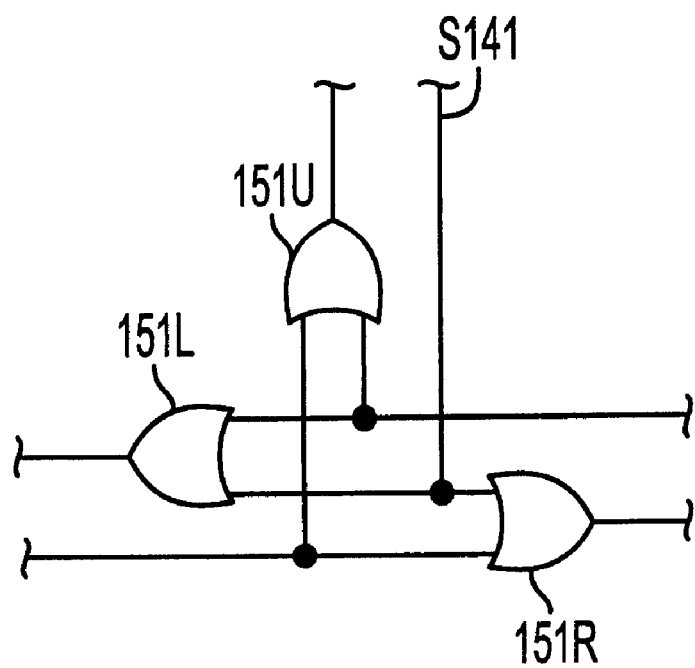
FIG. 10 is a circuit diagram illustrative of yet another circuit configuration of the OR-circuit shown in FIG. 2 as a further modification to the OR-circuit shown in FIG. 3.

FIG. 9 is a circuit diagram illustrative of still another circuit configuration of the OR-circuit 151 of the bidirectional repeater controller. The OR-circuit 151 comprises two-input logical OR-gates 151L/151R, 152L/152R, and 153L/153R and four-input logical OR-gates 181, 182 and 183. The bus driver control signals S141-0, S141-1, S141-2 and S141-3 are inputted into four input terminals of the four-input logical OR-gate 181. The bus driver control signals S142-0, S142-1, S142-2 and S142-3 are inputted into four input terminals of the four-input logical OR-gate 182. The bus driver control signals S143-0, S143-1, S143-2 and S143-3 are inputted into four input terminals of the four-input logical OR-gate 183. An output from the four-input logical OR-gate 181 is inputted into the two input OR-gates 151R and 151L. An output from the four-input logical OR-gate 182 is inputted into the two input OR-gates 152R and 152L. An output from the four-input logical OR-gate 183 is inputted into the two input OR-gates 153R and 153L. An output of the OR-gate 151R is connected to the input of the OR-gate 152R. An output of the OR-gate 152R is connected to the input of the OR-gate 153R. An output of the OR-gate 153L is connected to the input of the OR-gate 152L. An output of the OR-gate 152L is connected to the input of the OR-gate 151L. An output signal from the OR-gate 151R is supplied as the bidirectional repeater control signal S161R. An output signal from the OR-gate 152L is supplied as the bidirectional repeater control signal S161L. An output signal from the OR-gate 152R is supplied as the bidirectional repeater control signal S162R. An output signal from the OR-gate 153L is supplied as the bidirectional repeater control signal S162L FIG. 10 is a circuit diagram illustrative of yet another circuit configuration of the OR-circuit shown in FIG. 2 as a further modification to the OR-circuit shown in FIG. 3. In addition to the OR-gates 151R, 151L, 152R, 152L, 153R and 153L shown in FIG. 3, two-input OR gates are further provided. Each of the two-input OR gates has two input terminals which are connected to the opposite direction OR-gates. For example, the two-input OR gate 151U has two input terminals connected to the input terminal of the OR-gate 151L and the input terminal of the OR-gate 151R. Even illustration is omitted, the two-input OR gate has two input terminals connected to the input terminal of the OR-gate 152L and the input terminal of the OR-gate 152R. The two-input OR gate has two input terminals connected to the input terminal of the OR-gate 153L and the input terminal of the OR-gate 153R.

SECOND EMBODIMENT

Figure 11:
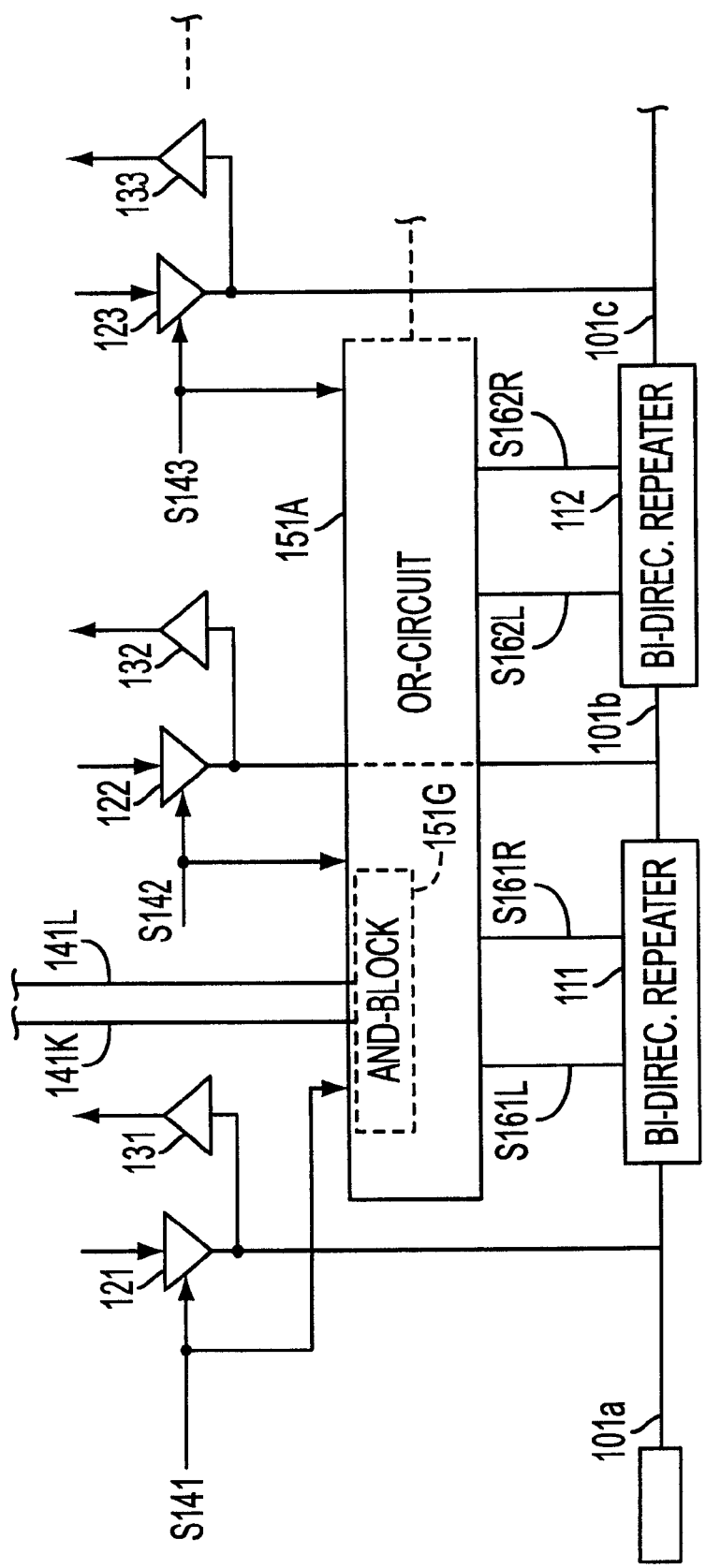
FIG. 11 is a block diagram illustrative of a novel bidirectional bus-repeater controller in a second embodiment in accordance with the present invention.

A second embodiment according to the present invention will be described in detail with reference to the drawings. FIG. 11 is a block diagram illustrative of a novel bidirectional bus-repeater controller in a second embodiment in accordance with the present invention. A bus line 101 is divided into bus lines 101a, 101b, 101c, etc. A plurality of bidirectional repeaters 111 and 112 are provided on the bus line 101 so that the bidirectional repeater 111 is connected between the bus line 101a and bus line 101b, whilst the bidirectional repeater 112 is connected between the bus line 101b and bus line 101c. A first set of a first bus driver 121 and a first bus receiver 131 is connected the bus line 101a. A second set of a second bus driver 122 and a second bus receiver 132 is connected to the bus line 101b. A third set of a third bus driver 123 and a third bus receiver 133 is connected to the bus line 101c. The bus driver 121 receives an input of a bus driver control signal S141. If the bus control signal S141 is high level, or "1" which represent "enable", an input signal inputted into the bus driver 121 is transmitted to the bus line 101a. This output signal is subjected to a buffering process by the bidirectional repeater 111 for subsequent high speed transmission on the bus line 101a. The bus driver 122 receives an input of a bus driver control signal S142. If the bus driver control signal S142 is high level or "1" which represent "enable", an input signal inputted into the bus driver 122 is transmitted to the bus line 101b. This output signal is subjected to a buffering process by the bidirectional repeaters 111 and 112 for subsequent high speed transmission on the bus line 101b. The bus driver 123 receives an input of a bus driver control signal S143. If the bus driver control signal S143 is high level or "1" which represent "enable", an input signal inputted into the bus driver 123 is transmitted to the bus line 101c. This output signal is subjected to a buffering process by the bidirectional repeater 112 for subsequent high speed transmission on the bus line 101c.

The bus receivers 131, 132 and 133 receive bus data from the bus lines 101a, 101b and 101c, so as to transmit the signals to the bus drivers 121, 122, and 123 which receive the enable signal or the bus driver control signals S141, S142 and S143 which are high level "1".

An OR-circuit 151A has an AND gate block 151G. bus signals 141R and 141L are inputted into the AND gate block 151G. The OR-circuit 151A is connected to the bidirectional repeaters 111 and 112 to transmit bidirectional repeater control signals S161L and S161R to the bidirectional repeater 111 and also transmit bidirectional repeater control signals S162L and S162R to the bidirectional repeater 112. The OR-circuit 151 receives the bus driver control signals S141, S142, and S143 for OR-operations of the bus driver control signals S141, S142, and S143 to generate the bidirectional repeater control signals S161L and S161R and S162L and S162R which are transmitted to the bidirectional repeaters 111 and 112 respectively, so that signal transmissions arc made at a starting point of the bus driver receiving the bus driver control signal which is high level "1".

Figure 12:
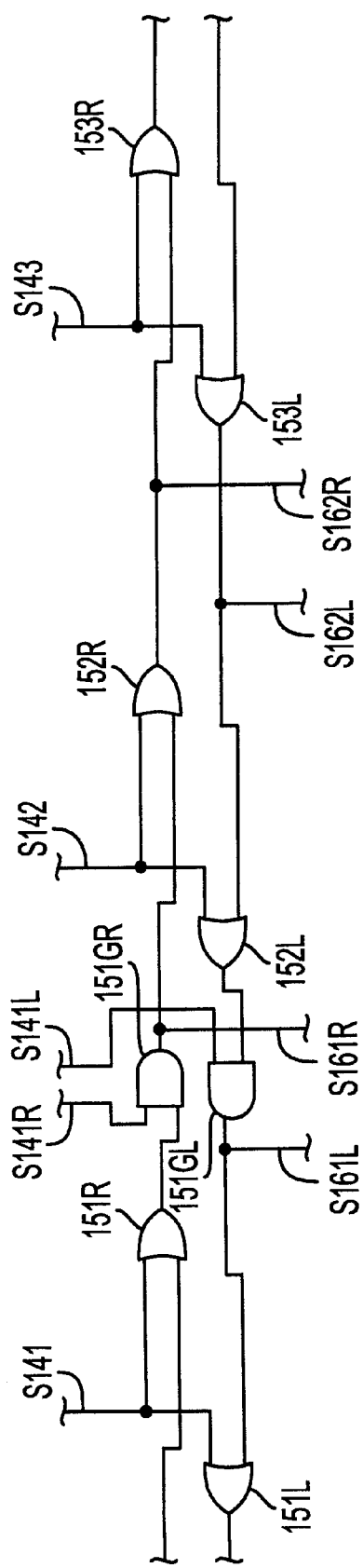
FIG. 12 is a circuit diagram illustrative of a circuit configuration of the OR-circuit of the bidirectional repeater controller.

FIG. 12 is a circuit diagram illustrative of a circuit configuration of the OR-circuit 151 of the bidirectional repeater controller. The OR-circuit 151 comprises two-input logical OR-gates 151L/151R, 152L/152R, and 153L/153R and AND-gates 151GR and 151GL. The bus driver control signal S141 is inputted into the OR-gates 151R and 151L. The bus driver control signal S142 is inputted into the OR-gates 152R and 152L. The bus driver control signal S143 is inputted into the OR-gates 153R and 153L. The bus signal S141R is inputted into the AND-gate 151GR. The bus signal S141L is inputted into the AND-gate 151GL. An output of the OR-gate 151R is connected to the input of the AND-gate 151GR. An output of the AND-gate 151GR is connected to the input of the OR-gate 152R. An output of the OR-gate 152R is connected to the input of the OR-gate 153R.

An output of the OR-gate 153L is connected to the input of the OR-gate 152L. An output of the OR-gate 152L is connected to the input of the AND-gate 151GL. An output of the AND-gate 151GL is connected to the input of the OR-gate 151L. An output signal from the AND-gate 151GR is supplied as the bidirectional repeater control signal S161R. An output signal from the AND-gate 152GL is supplied as the bidirectional repeater control signal S161L. An output signal from the OR-gate 152R is supplied as the bidirectional repeater control signal S162R. An output signal from the OR-gate 153L is supplied as the bidirectional repeater control signal S162L.

The AND-gate 151GR performs AND-operation of the bus signal S141R and the output from the OR-gate 151R. The AND-gate 151GL performs AND-operation of the bus signal S141L and the output from the OR-gate 152L. the provisions of the AND-gates 151GR and 151GL discontinue transmissions of the bidirectional repeater control signals, thereby to prevent any unnecessary change of the bus signals to reduce the power consumption. Further, individual use of the bidirectional bus realizes highly efficient signal transmissions.

THIRD EMBODIMENT

Figure 13:
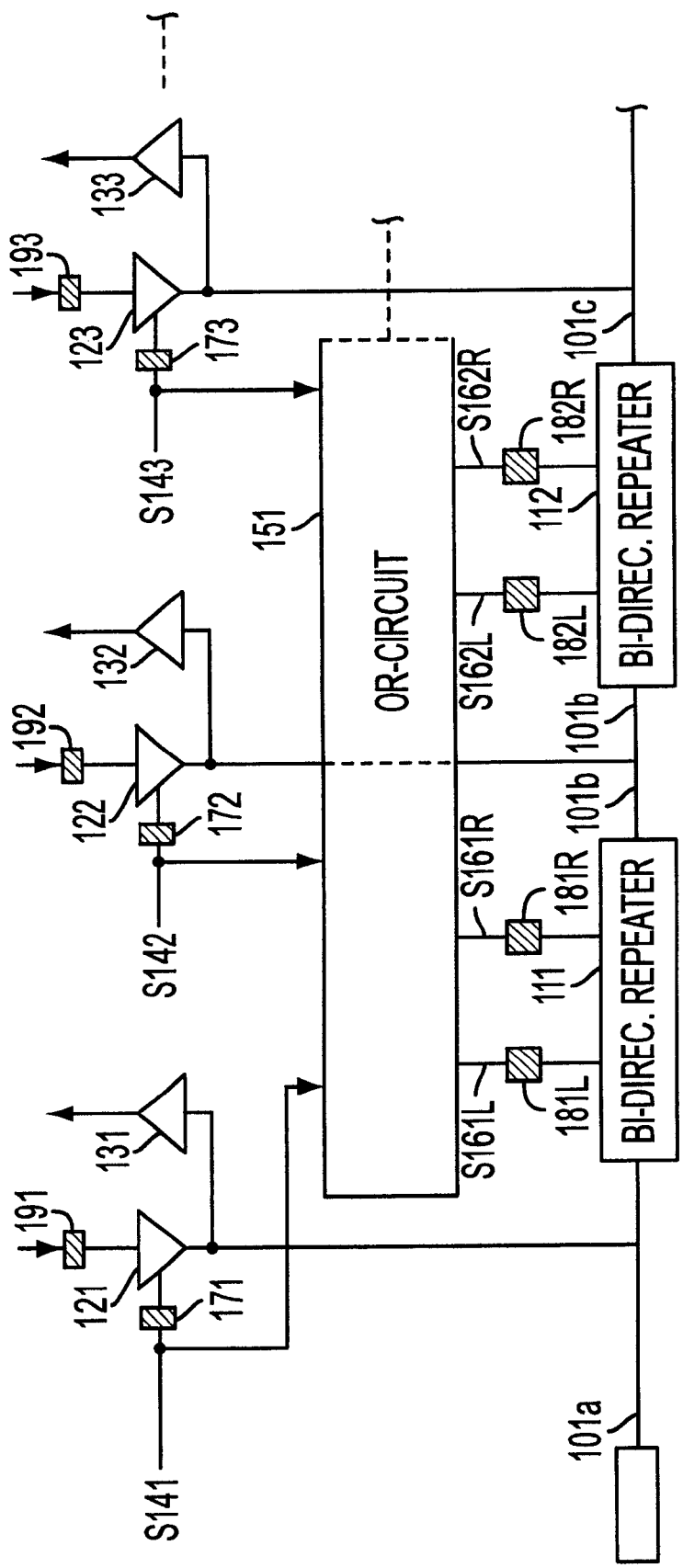
FIG. 13 is a block diagram illustrative of a novel bidirectional bus-repeater controller in a third embodiment in accordance with the present invention.

A third embodiment according to the present invention will be described in detail with reference to the drawings. FIG. 13 is a block diagram illustrative of a novel bidirectional bus-repeater controller in a third embodiment in accordance with the present invention. A bus line 101 is divided into bus lines 101a, 101b, 101c, etc. A plurality of bidirectional repeaters 111 and 112 are provided on the bus line 101 so that the bidirectional. repeater 111 is connected between the bus line 101a and bus line 101b, whilst the bidirectional repeater 112 is connected between the bus line 101b and bus line 101c. A first set of a first bus driver 121 and a first bus receiver 131 is connected the bus line 101a. A second set of a second bus driver 122 and a second bus receiver 132 is connected to the bus line 101b. A third set of a third bus driver 123 and a third bus receiver 133 is connected to the bus line 101c. The bus driver 121 receives an input of a bus driver control signal S141 through a resistor 171. The bus driver 121 also receives an input of an input signal through a resistor 191. If the bus control signal S141 is high level, or "1" which represent "enable", an input signal inputted into the bus driver 121 is transmitted to the bus line 101a. This output signal is subjected to a buffering process by the bidirectional repeater 111 for subsequent high speed transmission on the bus line 101a. The bus driver 122 receives an input of a bus driver control signal S142 through a resistor 172. The bus driver 122 also receives an input of an input signal through a resistor 192. If the bus driver control signal S142 is high level or "1" which represent "enable", an input signal inputted into the bus driver 122 is transmitted to the bus line 101b. This output signal is subjected to a buffering process by the bidirectional repeaters 111 and 112 for subsequent high speed transmission on the bus line 101b. The bus driver 123 receives an input of a bus driver control signal S143 through a resistor 173. The bus driver 123 also receives an input of an input signal through a resistor 193. If the bus driver control signal S143 is high level or "1" which represent "enable", an input signal inputted into the bus driver 123 is transmitted to the bus line 101c. This output signal is subjected to a buffering process by the bidirectional repeater 112 for subsequent high speed transmission on the bus line 101c.

The bus receivers 131, 132 and 133 receive bus data from the bus lines 101a, 101b and 101c, so as to transmit the signals to the bus drivers 121, 122, and 123 which receive the enable signal or the bus driver control signals S141, S142 and S143 which are high level "1".

An OR-circuit 151A is connected to the bidirectional repeaters 111 and 112 to transmit bidirectional repeater control signals S161L and S161R through resistors 181L and 181R to the bidirectional repeater 111 and also transmit bidirectional repeater control signals S162L and S162R through resistors 182L and 182R to the bidirectional repeater 112. The OR-circuit 151 receives the bus driver control signals S141, S142, and S143 for OR-operations of the bus driver control signals S141, S142, and S143 to generate the bidirectional repeater control signals S161L and S161R and S162L and S162R which are transmitted to the bidirectional repeaters 111 and 112 respectively, so that signal transmissions are made at a starting point of the bus driver receiving the bus driver control signal which is high level "1".

Figure 14:
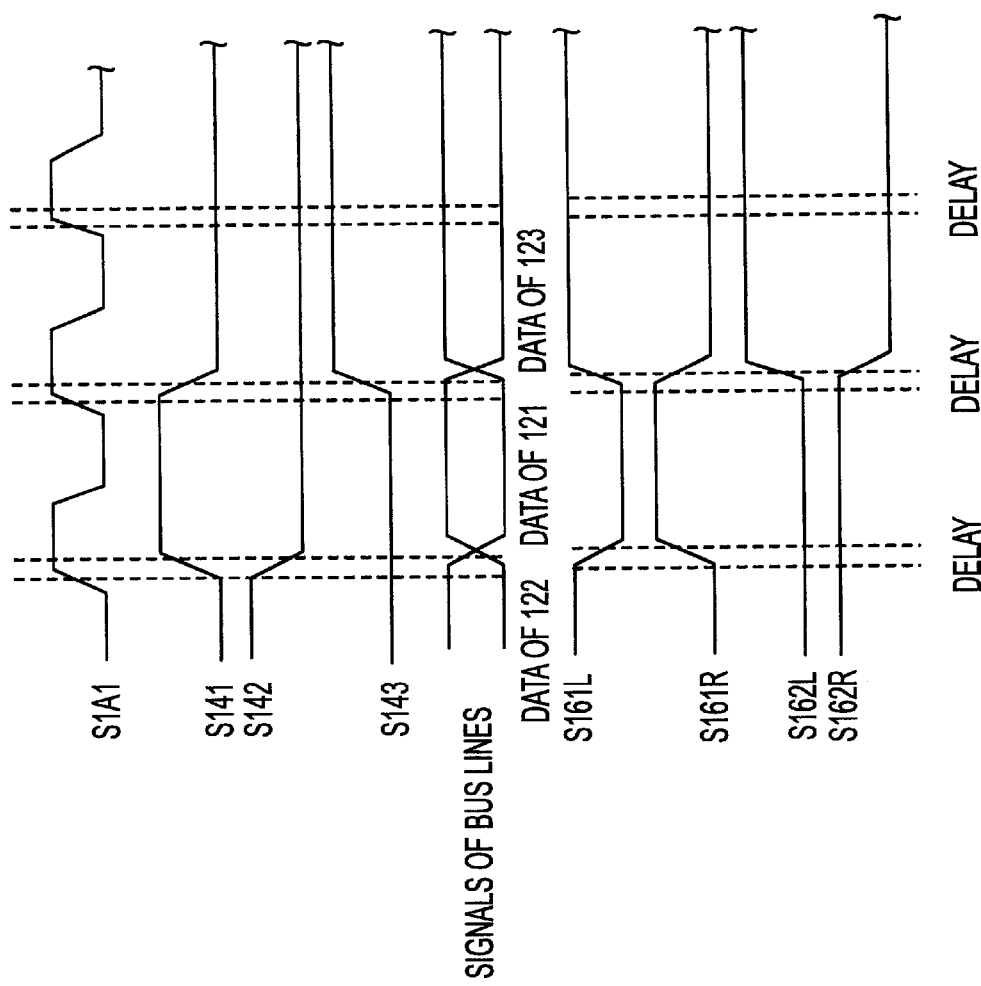
FIG. 14 is a timing chart illustrative of waveforms of control signals of the third novel bidirectional bus-repeater controller of FIG. 13.

FIG. 14 is a timing chart illustrative of waveforms of control signals of the third novel bidirectional bus-repeater controller of FIG. 13. The provisions of the resistors 171, 172, 173, 191, 192, 193, 181L and 181R and 182L and 182R allow operations without delay. Namely, the provisions of the resistors 171, 172, 173, 191, 192, 193, 181L and 181R and 182L and 182R prevent that if the bus driver control signal S141 is changed from "1" to "0" and the bus driver control signal S143 is changed from "0" to "1", then changes of the bidirectional repeater control signals S161L and S161R outputted from the OR-circuit 151 are delayed. Accordingly, the provisions of the resistors 171, 172, 173, 191, 192, 193, 181L and 181R and 182L and 182R allow changes of the bidirectional repeater control signals S161L and S161R outputted from the OR-circuit 151 without delay.

FOURTH EMBODIMENT

Figure 15:
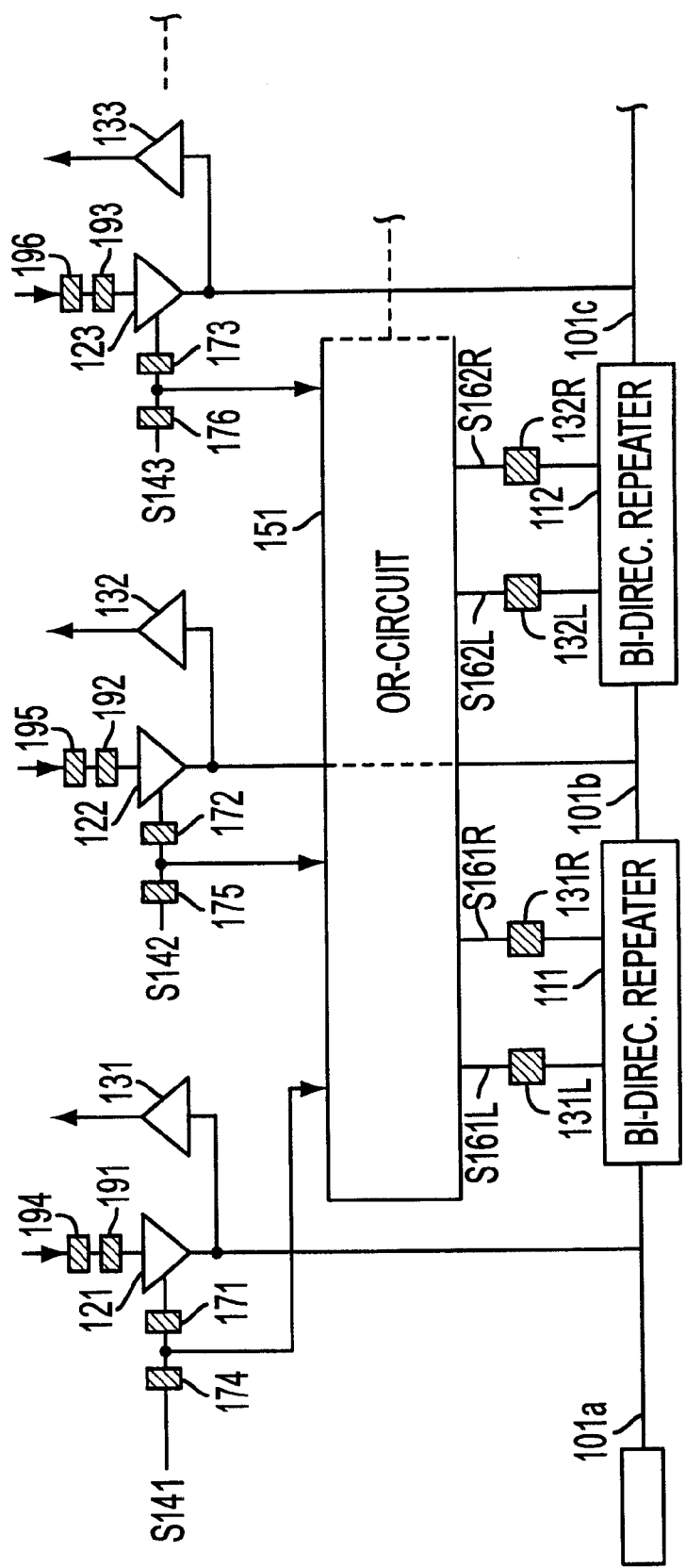
FIG. 15 is a block diagram illustrative of a novel bidirectional bus-repeater controller in a fourth embodiment in accordance with the present invention.

A fourth embodiment according to the present invention will be described in detail with reference to the drawings. FIG. 15 is a block diagram illustrative of a novel bidirectional bus-repeater controller in a fourth embodiment in accordance with the present invention. A bus line 101 is divided into bus lines 101a, 101b, 101c, etc. A plurality of bidirectional repeaters 111 and 112 are provided on the bus line 101 so that the bidirectional repeater 111 is connected between the bus line 101a and bus line 101b, whilst the bidirectional repeater 112 is connected between the bus line 101b and bus line 101c. A first set of a first bus driver 121 and a first bus receiver 131 is connected the bus line 101a. A second set of a second bus driver 122 and a second bus receiver 132 is connected to the bus line 101b. A third set of a third bus driver 123 and a third bus receiver 133 is connected to the bus line 101c. The bus driver 121 receives an input of a bus driver control signal S141 through a series connection of resistors 171 and 174. The bus driver 121 also receives an input of an input signal through a series connection of resistors 191 and 194. If the bus control signal S141 is high level, or "1" which represent "enable", an input signal inputted into the bus driver 121 is transmitted to the bus line 101a. This output signal is subjected to a buffering process by the bidirectional repeater 111 for subsequent high speed transmission on the bus line 101a. The bus driver 122 receives an input of a bus driver control signal S142 through a series connection of resistors 172 and 175. The bus driver 122 also receives an input of an input signal through a series connection of resistors 192 and 195. If the bus driver control signal S142 is high level or "1" which represent "enable", an input signal inputted into the bus driver 122 is transmitted to the bus line 101b. This output signal is subjected to a buffering process by the bidirectional repeaters 111 and 112 for subsequent high speed transmission on the bus line 101b. The bus driver 123 receives an input of a bus driver control signal S143 through a series connection of resistors 173 and 176. The bus driver 123 also receives an input of an input signal through a series connection of resistors 193 and 196. If the bus driver control signal S143 is high level or "1" which represent "enable", an input signal inputted into the bus driver 123 is transmitted to the bus line 101c. This output signal is subjected to a buffering process by the bidirectional repeater 112 for subsequent high speed transmission on the bus line 101c.

The bus receivers 131, 132 and 133 receive bus data from the bus lines 101a, 101b and 101c, so as to transmit the signals to the bus drivers 121, 122, and 123 which receive the enable signal or the bus driver control signals S141, S142 and S143 which are high level "1".

An OR-circuit 151S is connected to the bidirectional repeaters 111 and 112 to transmit bidirectional repeater control signals S161L and S161R through resistors 131L and 131R to the bidirectional repeater 111 and also transmit bidirectional repeater control signals S162L and S162R through resistors 132L and 132R to the bidirectional repeater 112. The OR-circuit 151 receives the bus driver control signals S141, S142, and S143 for OR-operations of the bus driver control signals S141, S142, and S143 to generate the bidirectional repeater control signals S161L and S161R and S162L and S162R which are transmitted to the bidirectional repeaters 111 and 112 respectively, so that signal transmissions are made at a starting point of the bus driver receiving the bus driver control signal which is high level "1".

It is possible to allocate one cycle of the bidirectional repeater control signals to improve high frequency performance.

FIFTH EMBODIMENT

Figure 16:
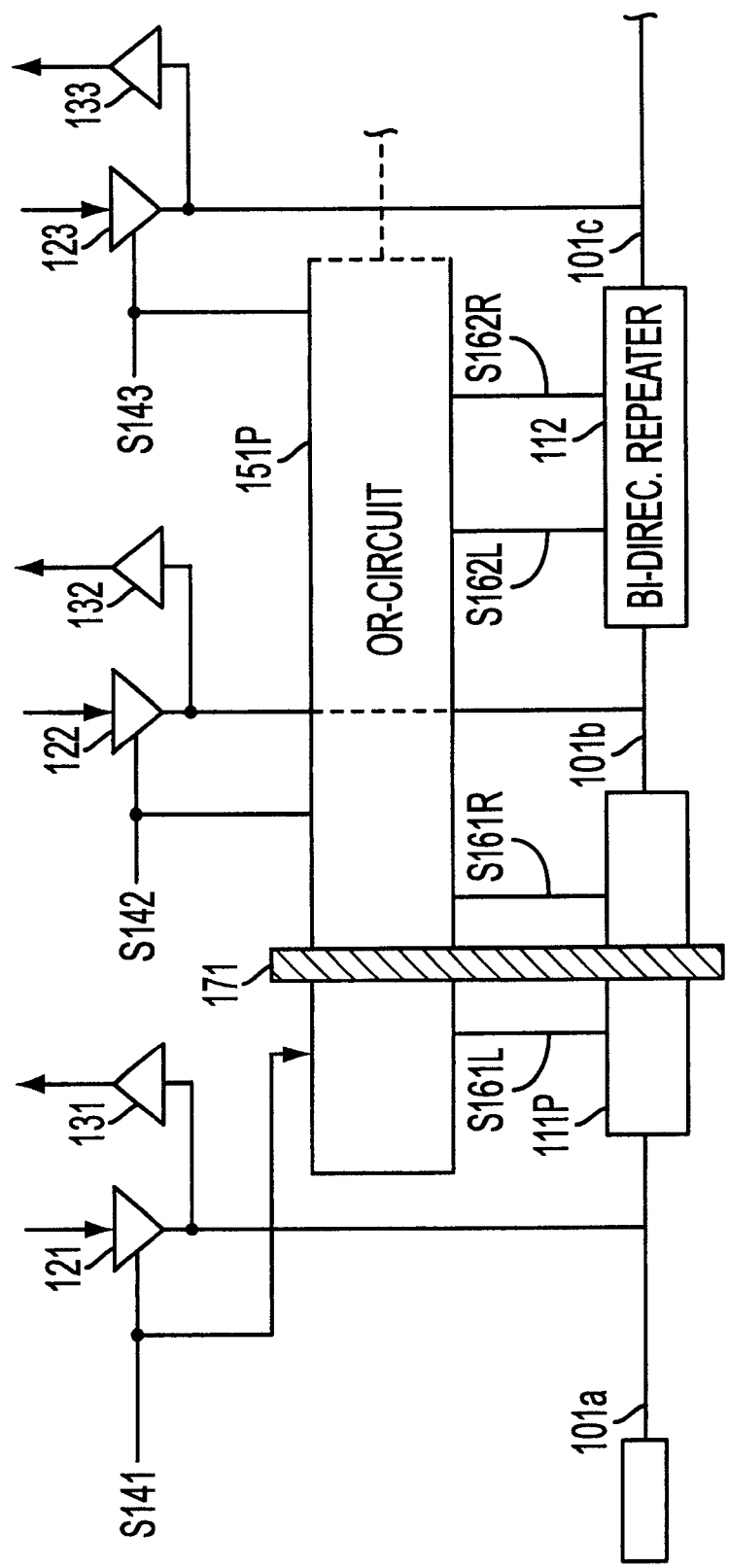
FIG. 16 is a block diagram illustrative of a novel bidirectional bus-repeater controller in a fifth embodiment in accordance with the present invention.

A fifth embodiment according to the present invention will be described in detail with reference to the drawings. FIG. 16 is a block diagram illustrative of a novel bidirectional bus-repeater controller in a second embodiment in accordance with the present invention. A bus line 101 is divided into bus lines 101a, 101b, 101c, etc. A plurality of bidirectional repeaters 111P and 112 are provided on the bus line 101 so that the bidirectional repeater 111P is connected between the bus line 101a and bus line 101b, whilst the bidirectional repeater 112 is connected between the bus line 101b and bus line 101c. A first set of a first bus driver 121 and a first bus receiver 131 is connected the bus line 101a. A second set of a second bus driver 122 and a second bus receiver 132 is connected to the bus line 101b. A third set of a third bus driver 123 and a third bus receiver 133 is connected to the bus line 101c. The bus driver 121 receives an input of a bus driver control signal S141. If the bus control signal S141 is high level, or "1" which represent "enable", an input signal inputted into the bus driver 121 is transmitted to the bus line 101a. This output signal is subjected to a buffering process by the bidirectional repeater 111P for subsequent high speed transmission on the bus line 101a. The bus driver 122 receives an input of a bus driver control signal S142. If the bus driver control signal S142 is high level or "1" which represent "enable", an input signal inputted into the bus driver 122 is transmitted to the bus line 101b. This output signal is subjected to a buffering process by the bidirectional repeaters 111P and 112 for subsequent high speed transmission on the bus line 101b. The bus driver 123 receives an input of a bus driver control signal S143. If the bus driver control signal S143 is high level or "1" which represent "enable", an input signal inputted into the bus driver 123 is transmitted to the bus line 101c. This output signal is subjected to a buffering process by the bidirectional repeater 112 for subsequent high speed transmission on the bus line 101c.

The bus receivers 131, 132 and 133 receive bus data from the bus lines 101a, 101b and 101c, so as to transmit the signals to the bus drivers 121, 122, and 123 which receive the enable signal or the bus driver control signals S141, S142 and S143 which are high level "1".

An OR-circuit 151P is connected to the bidirectional repeaters 111P and 112 to transmit bidirectional repeater control signals S161L and S161R to the bidirectional repeater 111P and also transmit bidirectional repeater control signals S162L and S162R to the bidirectional repeater 112. The OR-circuit 151P receives the bus driver control signals S141, S142, and S143 for OR-operations of the bus driver control signals S141, S142, and S143 to generate the bidirectional repeater control signals S161L and S161R and S162L and S162R which are transmitted to the bidirectional repeaters 111P and 112 respectively, so that signal transmissions are made at a starting point of the bus driver receiving the bus driver control signal which is high level "1". A pipeline resistor 171 is provided in both the OR-circuit 151P and the bidirectional repeater 111P in order to improve the high frequency performance.

Figure 17:
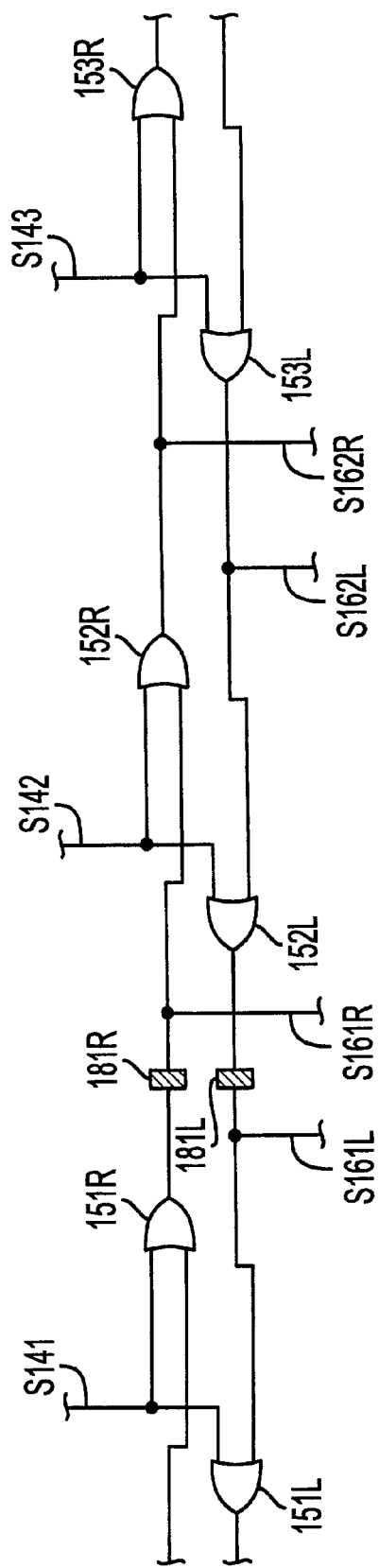
FIG. 17 is a circuit diagram illustrative of a circuit configuration of the OR-circuit of the bidirectional repeater controller.

FIG. 17 is a circuit diagram illustrative of a circuit configuration of the OR-circuit 151P of the bidirectional repeater controller. The OR-circuit 151 comprises two-input logical OR-gates 151L/151R, 152L/152R, and 153L/153R. The bus driver control signal S141 is inputted into the OR-gates 151R and 151L. The bus driver control signal S142 is inputted into the OR-gates 152R and 152L. The bus driver control signal S143 is inputted into the OR-gates 153R and 153L. An output of the OR-gate 151R is connected to the input of the OR-gate 152R. An output of the OR-gate 152R is connected through a pipeline resistor 181R to the input of the OR-gate 153R. An output of the OR-gate 153L is connected to the input of the OR-gate 152L. An output of the OR-gate 152L is connected through a pipeline resistor 181L to the input of the OR-gate 151L. An output signal from the OR-gate 151R is supplied through the pipeline resistor 181R as the bidirectional repeater control signal S161R. An output signal from the OR-gate 152L is supplied through the pipeline resistor 181L as the bidirectional repeater control signal S161L. An output signal from the OR-gate 152R is supplied as the bidirectional repeater control signal S162R. An output signal from the OR-gate 153L is supplied as the bidirectional repeater control signal S162L.

Figure 18:
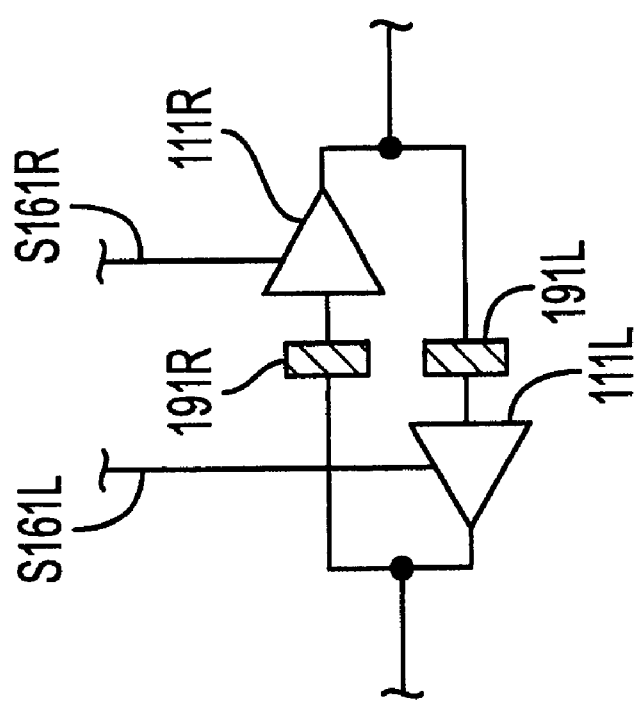
FIG. 18 is a circuit diagram illustrative of a circuit configuration of each of the bidirectional repeaters in the bidirectional bus repeater controller of FIG. 16.

FIG. 18 is a circuit diagram illustrative of a circuit configuration of each of the bidirectional repeaters in the bidirectional bus repeater controller of FIG. 16. The bidirectional repeater 111 comprises a first three-state buffer 111L and a second three-state buffer 111R and a first pipeline resistor 191L connected to the input terminal of the first three-state buffer 111L and a second pipeline resistor 191R connected to the input terminal of the second three-state buffer 111R. The first three-state buffer 111L receives the bidirectional repeater control signal S161L. The second three-state buffer 111R receives the bidirectional repeater control signal S161R. The provision of the pipeline resistor 171 may improve the high frequency performance.

Figure 19:
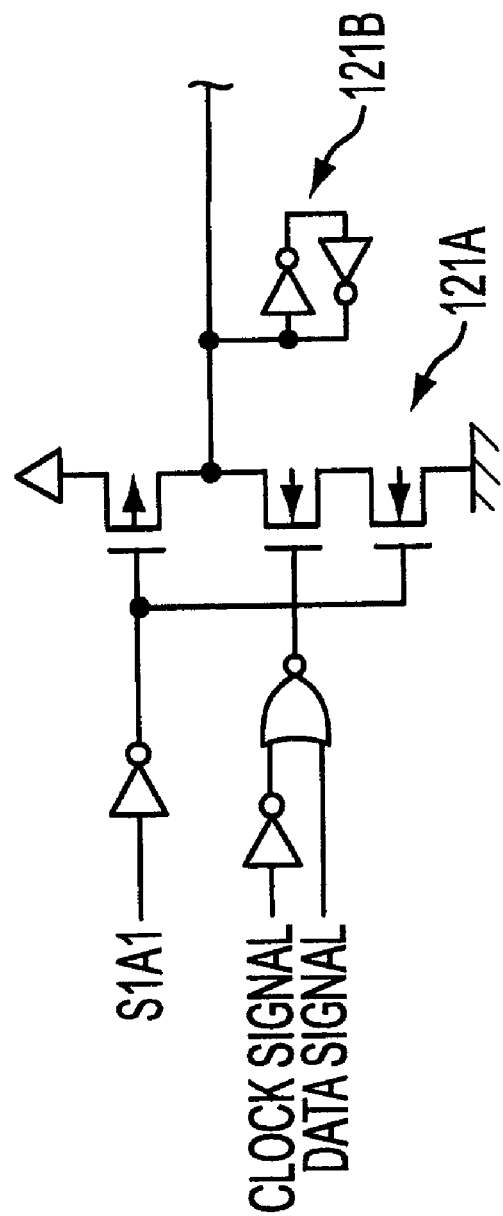
FIG. 19 is a circuit diagram illustrative of a modified circuit configuration for dynamic operations to improve high speed performance by modifying the circuit configurations of the third, four and fifth embodiment in accordance with the present invention.

FIG. 19 is a circuit diagram illustrative of a modified circuit configuration for dynamic operations to improve high speed performance by modifying the circuit configurations of the third, four and fifth embodiment in accordance with the present invention. Dynamic three state buffer 121A is provided for each of three state buffers 111L and 111R constitute bus drivers 121, 122 and 123 and the bidirectional repeaters 111(111P) and 112.

During pre-charge operation, the bus drivers 121, 122 and 123 and the bidirectional repeaters 111(111P) and 112 become high impedance states and no driving is made. If the pre-charge time period can be shortened or a delay in generation of the control signal can be cut off, the signal direction is made unidirectional from the high level "1" to the low level "0". Since the n-channel MOS transistor is used as a switch high has a high driving capability, the high speed performance can be improved. During the precharge time period, the bus line is not driven, for which reason it is necessary to add a bus holder 121B to prevent floating state. It is also possible to add a dynamic buffer to the circuit of FIG. 13.

Figure 20A:
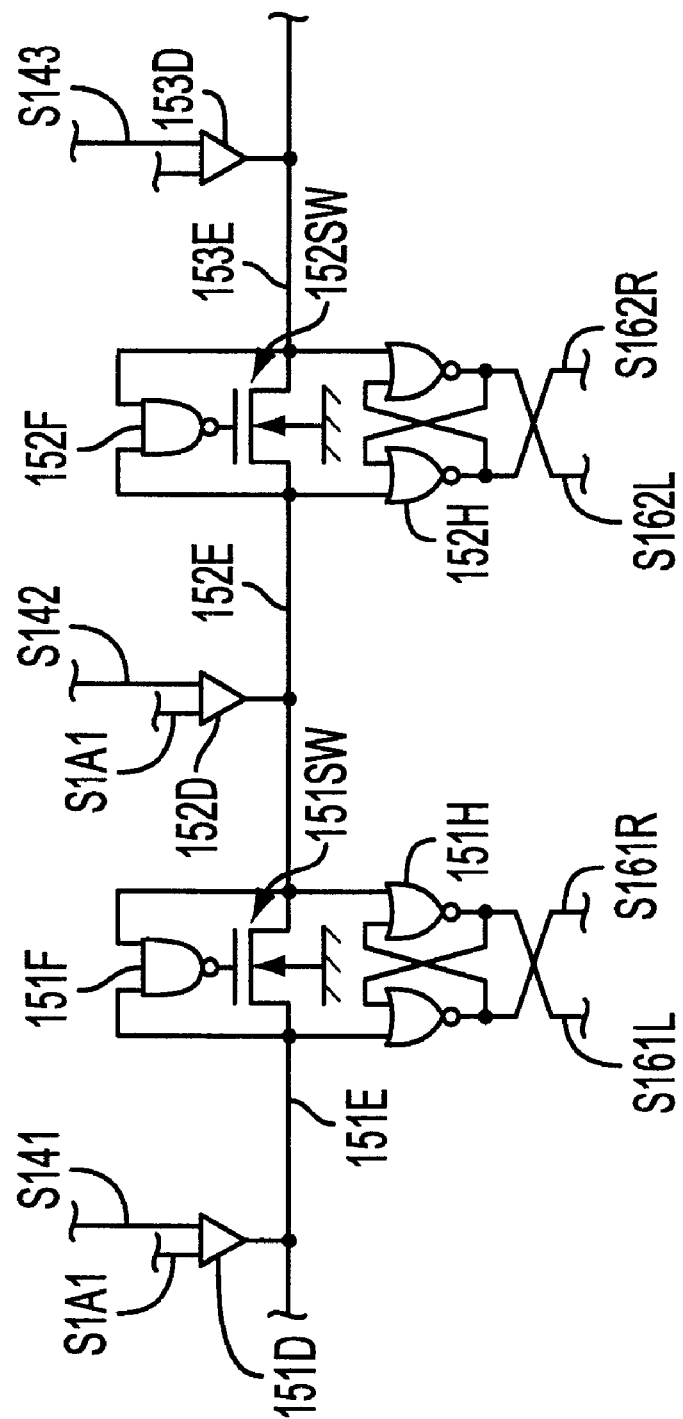
FIG. 20A is a circuit diagram illustrative of another modified circuit configuration for dynamic operations to improve high speed performance by modifying the circuit configurations of the third, four and fifth embodiment in accordance with the present invention.
Figure 20B:
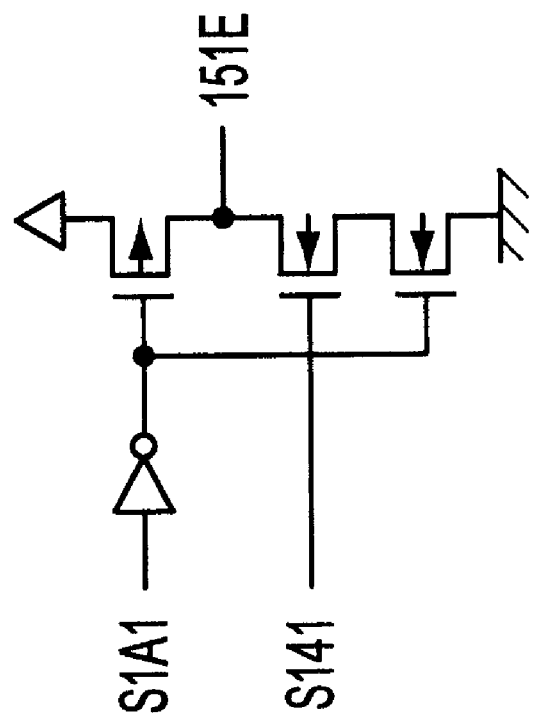
FIG. 20B is a circuit diagram illustrative of a dynamic buffer in FIG. 20A.

FIG. 20A is a circuit diagram illustrative of another modified circuit configuration for dynamic operations to improve high speed performance by modifying the circuit configurations of the third, four and fifth embodiment in accordance with the present invention. FIG. 20B is a circuit diagram illustrative of a dynamic buffer in FIG. 20A. In place of resisters 171, 172 and 173 and 191, 192 and 193 shown in FIG. 13, dynamic buffers 151D, 152D and 153D are provided. As shown in FIG. 20B, upon input of the bus driver control signal S141 into the dynamic buffer, a clock signal S1A1 inputted through an inverter into the dynamic buffer is outputted and transmitted on a NOR signal line 151E.

In this case, the circuit configuration for responding to the requirement for making the bus dynamic is unnecessary. Signal tramping on the bus line can be suppressed to reduce the power consumption. Making the entire of the OR-circuit dynamic reduces the control signals into one half and also realize interconnection layout with the branches.

Figure 21:
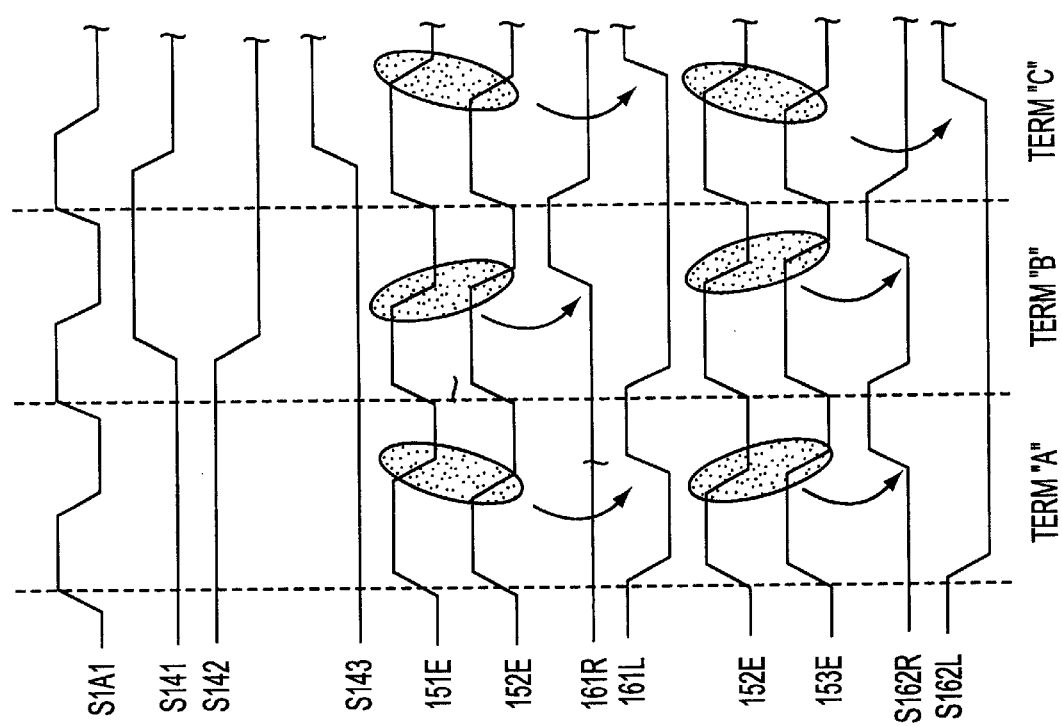
FIG. 21 is a timing chart of waveforms of control signals of still another modified circuit configuration provided with dynamic buffers.

FIG. 21 is a timing chart of waveforms of control signals of still another modified circuit configuration provided with dynamic buffers. If the clock signal S1A1 is high level "1", the NOR signal lines 151E and 152E are high level "1", whereby NAND gates 151F and 152F output "0", and further n-channel MOS switching transistors 151SW and 152SW turn OFF, whereby the bidirectional repeater control signals S161R, S161L, S162R and S162L from the NOR latch circuits 151H and 151L are "0". The three-state buffers constituting the bidirectional repeaters 111 and 112 become high impedance states. If the clock signal S1A1 becomes "0", the bus driver control signal becomes "1", whereby the dynamic buffer outputs "0" to fall the NOR signal line.

A time period "A" of FIG. 21, the NOR signal line 152E is "0", and the n-channel MOS switching transistors 151SW and 152SW turn ON, and the bidirectional repeater control signals S161l and S162R become "1" to set signal directions of the bidirectional repeaters 111 and 112 to be left and right directions respectively. Subsequently, the levels of the NOR signal lines 151E and 152E begin to be fallen to "0". The NOR signal lines 151E and 152E become "0", whereby the NOR latch circuits 151H and 152H are made into data latch mode. The same operations are transmitted in right and left directions.

Figure 22:
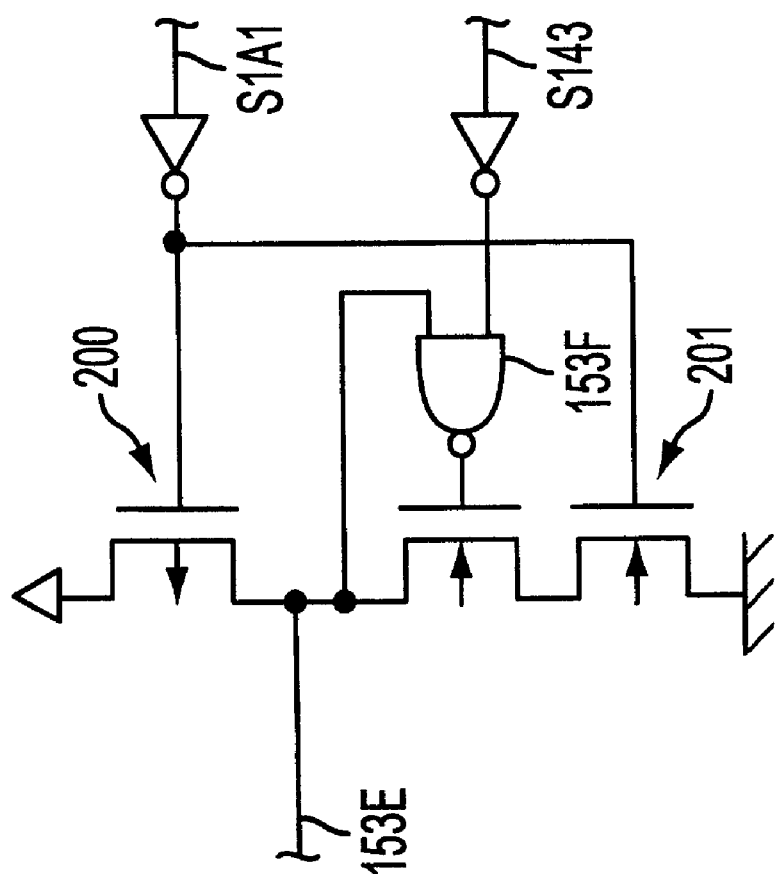
FIG. 22 is a circuit diagram illustrative of another modified circuit configuration by use of co-operating dynamic buffers in accordance with the present invention.
Figure 23:
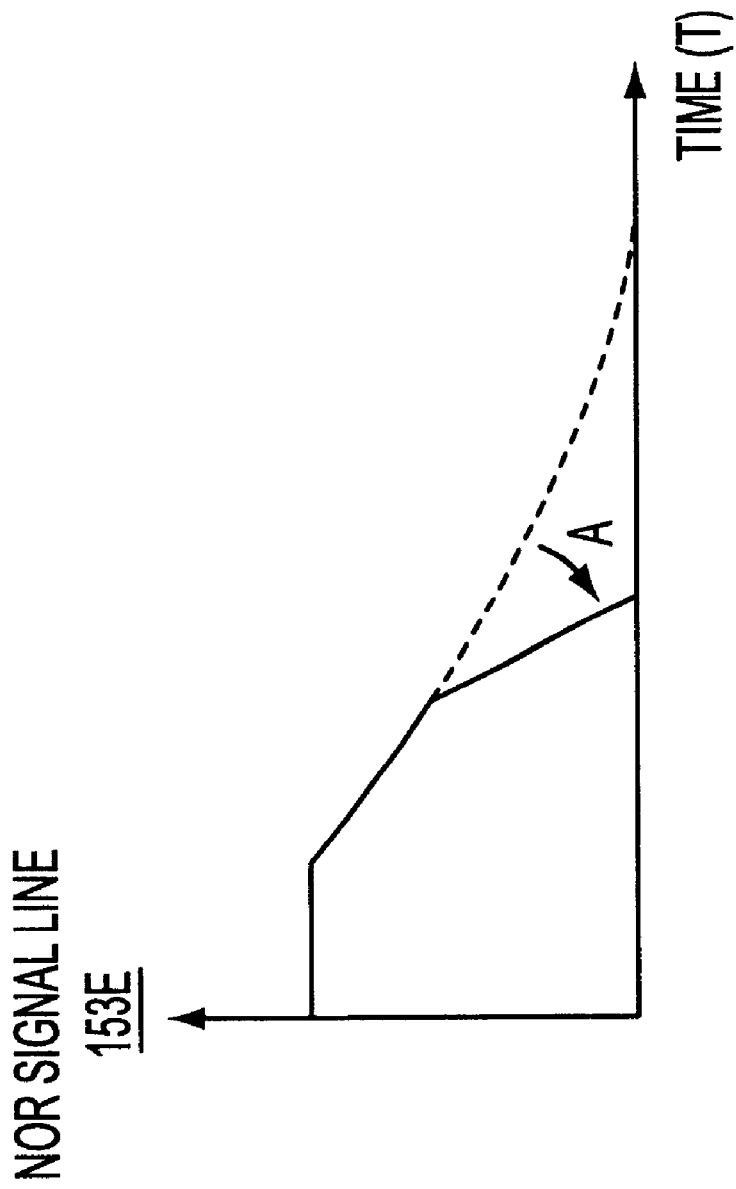
FIG. 23 is a timing chart illustrative of waveforms of control signals of another modified circuit configuration by use of co-operating dynamic buffers of FIG. 22 which performs acceleration effect.

FIG. 22 is a circuit diagram illustrative of another modified circuit configuration by use of co-operating dynamic buffers in accordance with the present invention. FIG. 23 is a timing chart illustrative of waveforms of control signals of another modified circuit configuration by use of co-operating dynamic buffers of FIG. 22 which performs acceleration effect.

As shown in FIG. 22, in place of the dynamic buffers in FIG. 20a, co-operating dynamic buffers are used to cause high speed performances in rising and falling the NOR signal lines 151E and 153E.

In FIGS. 22 and 23, if the clock signal S1A1 is "0", then the p-channel MOS switching transistor 200 connected to a power source turns OFF whilst the n-channel MOS switching transistor 201 connected to a ground turns ON. Upon detecting by the NAND gate 153F of rising of the NOR signal line, the NAND gate 153F becomes "1" whereby the n-channel MOS switching transistor turns ON to accelerate the falling of the logic value of the NOR signal line 153E a shown by an arrow mark "A".

Figure 24:
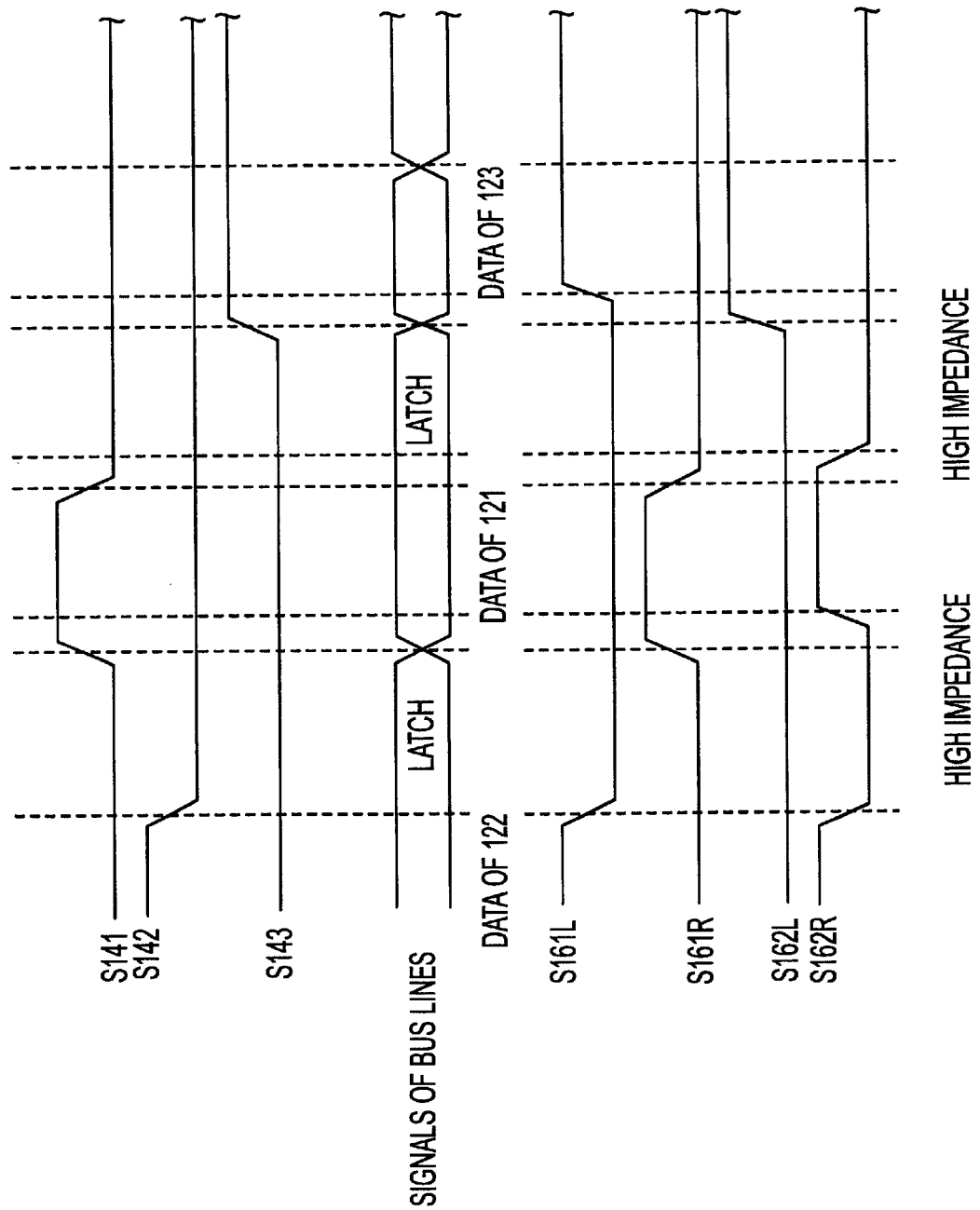
FIG. 24 is a timing chart illustrative of waveforms of control signals to explain bus fight.

FIG. 24 is a timing chart illustrative of waveforms of control signals to explain bus fight. Upon switching the bus driver control signals, one cycle operation is entirely set to be high impedance to prevent the bus fight. A bus holder may be provided to prevent floating state during one cycle operation.

SIXTH EMBODIMENT

Figure 25:
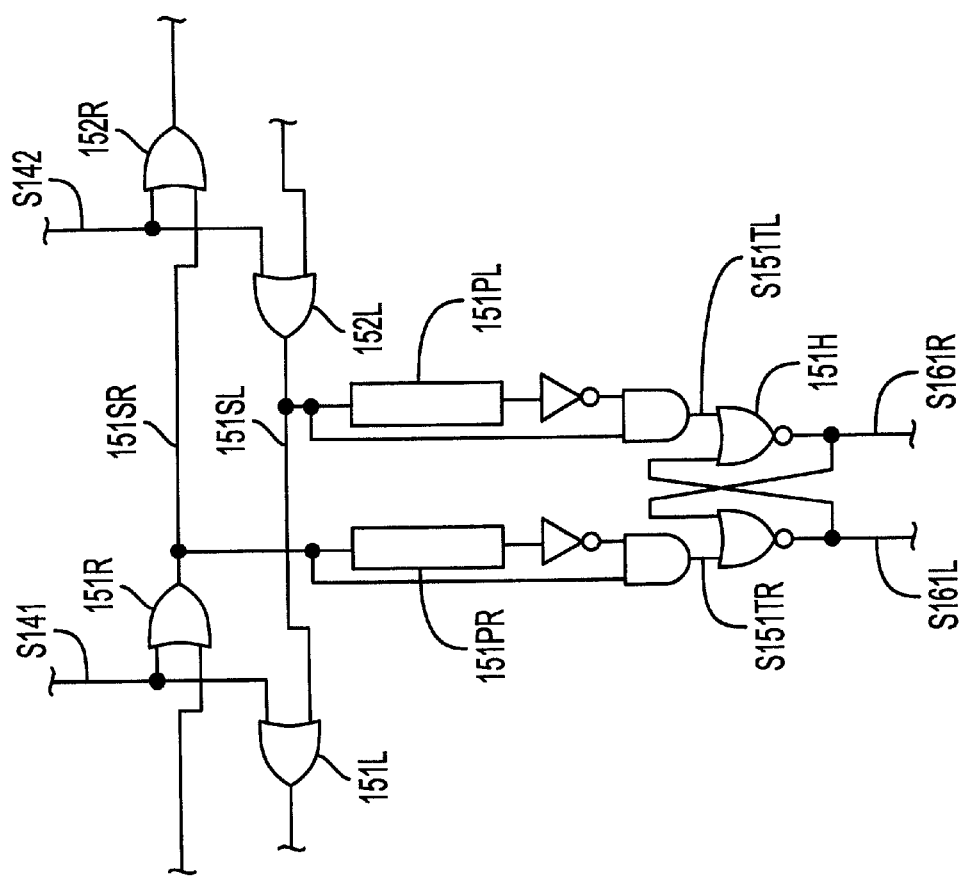
FIG. 25 is a block diagram illustrative of a novel bidirectional bus-repeater controller in a sixth embodiment in accordance with the present invention.
Figure 26:
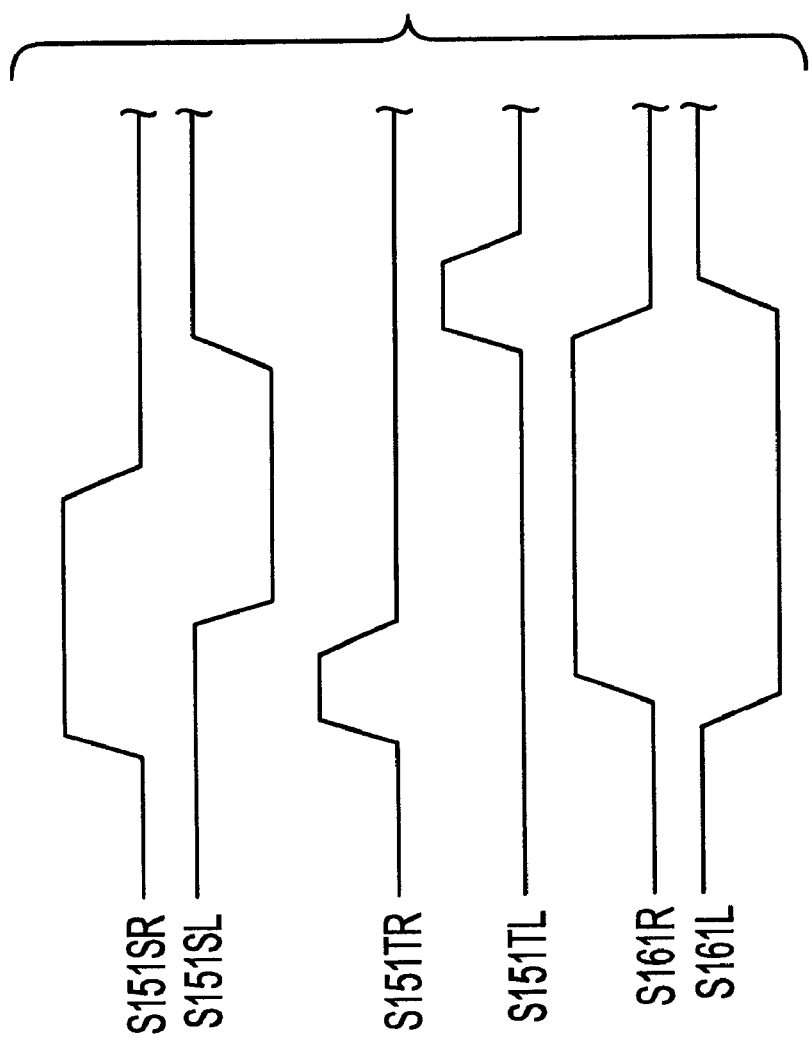
FIG. 26 is a timing chart illustrative of waveforms of control signals of the novel bidirectional bus-repeater controller of FIG. 25. In the above second embodiment, in order to prevent the bus fight, the control signals are concurrently operated or the high impedance states are set.

A sixth embodiment according to the present invention will be described in detail with reference to the drawings. FIG. 25 is a block diagram illustrative of a novel bidirectional bus-repeater controller in a sixth embodiment in accordance with the present invention. FIG. 26 is a timing chart illustrative of waveforms of control signals of the novel bidirectional bus-repeater controller of FIG. 25. In the above second embodiment, in order to prevent the bus fight, the control signals are concurrently operated or the high impedance states are set. In this sixth embodiment, in order to prevent the bus fight, a three-state buffer in a side where a bus fight appears upon transmission of the opposite directional signal is set to be high impedance.

In FIG. 25, this OR-circuit performs set/reset latch processes. In a stationary state, reset/set latch input is latched as "0,0". A control signal for a forward transmission direction is supplied as a set (S) whilst a control signal for a reverse transmission direction is supplied as a reset (R). signals on OR signal lines 151SR and 151SL and rise signals S151TR and S151TL from the AND gates inputted with the delay inverted signals and the signals from the OR signal lines 151SR and 151SL are inputted into a NOR latch circuit 151H to generate bidirectional repeater control signals 161R and 161L.

In FIG. 26, even the bus driver control signal is exclusive, the time periods of "1" may be overlapped due to transmission delays of the OR-circuit. When the OR signal line 151SR rises, then the OR signal line SL remains "1". The OR signal line 151SR rises whereby a pulse appears in the rise signal S1S1TP, If the rise signal S151TL is "0" whilst the rise signal S151TR is "1", then the bidirectional repeater control signals S161L and S161R as outputs from the NOR latch circuit 151H are "0" and "1" respectively.

If the rise signal S151TR becomes "0", this state is latched. After the OR signal line S151SR has been fallen until the rise signal S151TL rises, the latching is continued. Upon rising the OR signal line 151SL, a pulse appears on the rise signal S151TL. The bidirectional repeater control signal S161R becomes "0", and the bidirectional repeater control signal S161L becomes "1".

In response to a new driving pulse, the current driving is discontinued. As a result, the bidirectional repeater control is made with reduced bus fight. If the three state buffer in a side where the bus fight appears upon the opposite direction signal transmission is set to be high impedance to prevent the bus fight.

In this sixth embodiment, the OR-circuit performs latch operation whereby the bus holder is not necessary. In order to reduce the excess driving due to the bidirectional repeater, a floating state is caused on the bus line. AND operation of the bidirectional repeater control signals S161R and the OR signal line 151SR and AND operation of the bidirectional repeater control signals S161L and the OR signal line 151SL are made.

The NOR latch circuit (reset/set latch circuit) 151H may be modified into NAND latch circuit configuration. In accordance with the layout of the bus drivers and the bidirectional repeaters, it is effective for improvement of the high speed performance to insert the repeater and make a hierarchy of the logic OR of the bus driver control signals.

Transmission on the bus line may be made in pipeline, for which purpose it is possible to provide the pipeline resistor to improve the high frequency performance. A set of the bidirectional repeaters is set to be high impedance state to divide the bus line for restricting unnecessary signal transmission and reduction in power consumption. This may be applied to independent signal transmissions.

As described in the foregoing embodiments, the bidirectional bus repeater controller is provided with the OR-circuit inputted with the bus driver control signals along the bus line for controlling the bidirectional repeaters and also provided with interconnections inter-connecting the OR-circuit and the bidirectional repeaters.

Namely, a relatively long bidirectional bus line is divided to allow the bidirectional repeaters to control bidirectional signal transmissions, so as to prevent that bidirectional repeater control signal lines are laid out from a single controller to all of the bidirectional repeaters. As a result, the signal delay can be suppressed. High speed data processings can be realized.

The bidirectional repeater control signals are outputted by division-driving of the OR-circuit, so that even the bus line is long, it is suppressed to the delay of the control signals similarly to the bidirectional repeaters.

The bidirectional repeater control signals are transmitted unidirectionally, for which reason if a distance between the OR-gates is lag it is possible to add repeaters onto the interconnections of the OR-circuit and the bidirectional repeater control signal lines whereby a freedom of layout is improved.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network, said OR-gate network comprising:
      a first series connection of first directional OR-gates inputted with a logic-OR signal from a previous stage and with said bus driver control signal for transmitting logic signals in a first direction; and
      a first series connection of second directional OR-gates inputted with a logic-OR signal from a previous stage and with said bus driver control signal for transmitting logic signals in a second direction opposite to said first direction,
      wherein an output terminal of at least one of said first directional OR-gates is connected to said at least bidirectional repeater for transmitting a logic-OR signal outputted from said one of said first directional OR-gates as a first bidirectional repeater control signal to said at least bidirectional repeater, and
      an output terminal of at least one of said second directional OR-gates is also connected to said at least bidirectional repeater for transmitting a logic-OR signal outputted from said one of said second directional OR-gates as a second bidirectional repeater control signal to said at least bidirectional repeater.

2. The logic circuitry as claimed in claim 1, wherein said first directional OR-gates and said second directional OR-gates are two-input OR-gates having two input terminals, where one input terminal being for receiving said bus driver control signal and another input terminal being for receiving a signal from a previous stage OR-gate.

3. The logic circuitry as claimed in claim 1, wherein said first directional OR-gates and said second directional OR-gates are multiple-input OR-gates having three more input terminals, where one input terminal being for receiving a signal from a previous stage OR-gate and other input terminals being for receiving a plurality of said bus driver control signals.

4. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network, said OR-gate network comprising:
      a first series connection of first directional two-input OR-gates inputted with a logic-OR signal from a previous stage and with an output signal from an output terminal of a multiple-input OR-gate having the same number of input terminals as said plural bus driver control signals for transmitting logic signals in a first direction; and
      a first series connection of second directional two-input OR-gates inputted with a logic-OR signal from a previous stage and with said output signal from said output terminal of said multiple-input OR-gate for transmitting logic signals in a second direction opposite to said first direction,
      wherein an output terminal of at least one of said first directional two-input OR-gates is connected to said at least bidirectional repeater for transmitting a logic-OR signal outputted from said one of said first directional two-input OR-gates as a first bidirectional repeater control signal to said at least bidirectional repeater, and
      an output terminal of at least one of said second directional two-input OR-gates is also connected to said at least bidirectional repeater for transmitting a logic-OR signal outputted from said one of said second directional two-input OR-gates as a second bidirectional repeater control signal to said at least bidirectional repeater.

5. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   a logic AND block extending on intermediate points of first and second series connections of first and second directional logic OR-gates.

6. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   at least a resistor between said OR-gate network and said at least bidirectional repeater for transmitting a bidirectional repeater control signal from said OR-gate network through said resistor to said at least bidirectional repeater.

7. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   at least a resistor at an input side of each of said bus driver for allowing said bus driver control signal to be inputted through said resistor into said bus driver.

8. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   at least a resistor at an input side on a data signal line connected with each of said bus driver for allowing data signals to be inputted through said resistor into said bus driver.

9. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   at least a resistor at an input side of said OR-gate network for allowing said bus driver control signal to be inputted through said resistor into said OR-gate network.

10. A logic circuitry, connected to at least one bidirectional repeater. disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network; and
   a pipeline resistor extending on both said OR-gate network and said at least bidirectional repeater.

11. A logic circuitry, connected to at least one bidirectional repeater disposed on a bidirectional bus line, for transmitting bidirectional bus repeater control signals to said bidirectional repeater upon input of a bus driver control signal, said bus driver control signal being inputted to at least one bus driver connected to said bidirectional bus line, comprising:
   an OR-gate network,
   wherein said OR-gate network is provided with at least one dynamic buffer coupled to a switching circuit and a latch circuit.

12. The logic circuitry as claimed in claim 11, wherein said at least dynamic buffer comprises a co-operating dynamic buffer operating to accelerate falling of an output.

13. A bidirectional bus repeater controller comprising:
   a bidirectional bus line for bidirectional transmissions of signals;
   at least one bidirectional repeater on said bidirectional bus line for controlling bidirectional transmissions of signals on said bidirectional bus line;
   at least one bus driver connected to said bidirectional bus line for transmitting inputted signals to said bidirectional bus line in accordance with a bus driver control signal;
   at least one bus receiver connected to said bidirectional bus line for receiving signals from said bidirectional bus line; and
   a logic circuit extending along said bidirectional bus line and connected to said bidirectional repeater for transmitting bidirectional bus repeater control signals to said bidirectional repeater upon input of said bus driver control signal, said logic circuit comprising an OR-gate network,
   wherein said OR-gate network comprises:
      a first series connection of first directional OR-gates inputted with a logic-OR signal from a previous stage and with said bus driver control signal for transmitting logic signals in a first direction; and
      a first series connection of second directional OR-gates inputted with a logic-OR signal from a previous stage and with said bus driver control signal for transmitting logic signals in a second direction opposite to said first direction,
      wherein an output terminal of at least one of said first directional OR-gates is connected to said at least bidirectional repeater for transmitting a logic-OR signal outputted from said one of said first directional OR-gates as a first bidirectional repeater control signal to said at least bidirectional repeater, and
      an output terminal of at least one of said second directional OR-gates is also connected to said at least bidirectional repeater for transmitting a logic-OR signal outputted from said one of said second directional OR-gates as a second bidirectional repeater control signal to said at least bidirectional repeater.

14. The bidirectional bus repeater controller as claimed in claim 13, wherein said first directional OR-gates and said second directional OR-gates are two-input OR-gates having two input terminals, where one input terminal being for receiving said bus driver control signal and another input terminal being for receiving a signal from a previous stage OR-gate.

15. The bidirectional bus repeater controller as claimed in claim 13, wherein said first directional OR-gates and said second directional OR-gates are multiple-input OR-gates having three more input terminals, where one input terminal being for receiving a signal from a previous stage OR-gate and other input terminals being for receiving a plurality of said bus driver control signals.

16. A bidirectional bus repeater controller comprising:
   a bidirectional bus line for bidirectional transmissions of signals;
   at least one bidirectional repeater on said bidirectional bus line for controlling bidirectional transmissions of signals on said bidirectional bus line;
   at least one bus driver connected to said bidirectional bus line for transmitting inputted signals to said bidirectional bus line in accordance with a bus driver control signal;
   at least one bus receiver connected to said bidirectional bus line for receiving signals from said bidirectional bus line; and
   a logic circuit extending along said bidirectional bus line and connected to said bidirectional repeater for transmitting bidirectional bus repeater control signals to said bidirectional repeater upon input of said bus driver control signal, said logic circuit comprising an OR-gate network,
   wherein said OR-gate network comprises:
      a first series connection of first directional two-input OR-gates inputted with a logic-OR signal from a previous stage and with an output signal from an output terminal of a multiple-input OR-gate having the same number of input terminals as said plural bus driver control signals for transmitting logic signals in a first direction; and
      a first series connection of second directional two-input OR-gates inputted with a logic-OR signal from a previous stage and with said output signal from said output terminal of said multiple-input OR-gate for transmitting logic signals in a second direction opposite to said first direction,
      wherein an output terminal of at least one of said first directional two-input OR-gates is connected to said at least bidirectional repeater for transmitting a logic-OR signal outputted from said one of said first directional two-input OR-gates as a first bidirectional repeater control signal to said at least bidirectional repeater, and
      an output terminal of at least one of said second directional two-input OR-gates is also connected to said at least bidirectional repeater for transmitting a logic-OR signal outputted from said one of said second directional two-input OR-gates as a second bidirectional repeater control signal to said at least bidirectional repeater.

17. A bidirectional bus repeater controller comprising:
a bidirectional bus line for bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and
a logic AND block extending on intermediate points of first and second series connections of first and second directional logic OR-gates.

18. A bidirectional bus repeater controller comprising:
a bidirectional bus line for, bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and
at least a resistor between said OR-gate network and said at least bidirectional repeater for transmitting a bidirectional repeater control signal from said OR-gate network through said resistor to said at least bidirectional repeater.

19. A bidirectional bus repeater controller comprising:
a bidirectional bus line for bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and
at least a resistor at an input side of each of said bus driver for allowing said bus driver control signal to be inputted through said resistor into said bus driver.

20. A bidirectional bus repeater controller comprising:
a bidirectional bus line for bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and
at least a resistor at an input side on a data signal line connected with each of said bus driver for allowing data signals to be inputted through said resistor into said bus driver.

21. A bidirectional bus repeater controller comprising:
a bidirectional bus line for bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and
at least a resistor at an input side of said OR-gate network for allowing said bus driver control signal to be inputted through said resistor into said OR-gate network.

22. A bidirectional bus repeater controller comprising:
a bidirectional bus line for bidirectional transmissions of signals;
at least one bidirectional repeater on said bidirectional bus line for controlling bidirectional transmissions of signals on said bidirectional bus line;
at least one bus driver connected to said bidirectional bus line for transmitting inputted signals to said bidirectional bus line in accordance with a bus driver control signal;
at least one bus receiver connected to said bidirectional bus line for receiving signals from said bidirectional bus line;
a logic circuit extending along said bidirectional bus line and connected to said bidirectional repeater for transmitting bidirectional bus repeater control signals to said bidirectional repeater upon input of said bus driver control signal, said logic circuit comprising an OR-gate network; and a pipeline resistor extending on both said OR-gate network and said at least bidirectional repeater.

23. A bidirectional bus repeater controller comprising:

a bidirectional bus line for bidirectional transmissions of signals;

at least one bidirectional repeater on said bidirectional bus line for controlling bidirectional transmissions of signals on said bidirectional bus line;

at least one bus driver connected to said bidirectional bus line for transmitting inputted signals to said bidirectional bus line in accordance with a bus driver control signal;

at least one bus receiver connected to said bidirectional bus line for receiving signals from said bidirectional bus line; and a logic circuit extending along said bidirectional bus line and connected to said bidirectional repeater for transmitting bidirectional bus repeater control signals to said bidirectional repeater upon input of said bus driver control signal, said logic circuit comprising an OR-gate network wherein said OR-gate network is provided with at least one dynamic buffer coupled to a switching circuit and a latch circuit.

24. The bidirectional bus repeater controller as claimed in claim 23, wherein said at least dynamic buffer comprises a co-operating dynamic buffer operating to accelerate falling of an output.

* * * * *